US012588215B2

(12) United States Patent
Ling et al.

(10) Patent No.: US 12,588,215 B2
(45) Date of Patent: Mar. 24, 2026

(54) NON-VOLATILE MEMORY DEVICE HAVING SCHOTTKY DIODE

(71) Applicant: Peiching Ling, San Jose, CA (US)

(72) Inventors: Peiching Ling, San Jose, CA (US); Nanray Wu, Hayward, CA (US)

(73) Assignee: Peiching Ling

( * ) Notice: Subject to any disclaimer, the term of this patent is extended or adjusted under 35 U.S.C. 154(b) by 395 days.

(21) Appl. No.: 18/547,502

(22) PCT Filed: Mar. 21, 2022

(86) PCT No.: PCT/US2022/021065

§ 371 (c)(1),
(2) Date: Aug. 22, 2023

(87) PCT Pub. No.: WO2022/203978

PCT Pub. Date: Sep. 29, 2022

(65) Prior Publication Data

US 2024/0138155 A1    Apr. 25, 2024
US 2024/0237356 A9    Jul. 11, 2024

(30) Foreign Application Priority Data

Mar. 22, 2021    (TW) ................................. 110110254

(51) Int. Cl.
*H01L 23/528*       (2006.01)
*H10B 61/00*       (2023.01)
*H10B 63/00*       (2023.01)

(52) U.S. Cl.
CPC ........... *H10B 61/10* (2023.02); *H01L 23/528* (2013.01); *H10B 63/20* (2023.02)

(58) Field of Classification Search
CPC ........ H10B 61/10; H10B 63/20; H01L 23/528
See application file for complete search history.

(56) References Cited

U.S. PATENT DOCUMENTS

| | | | | |
|---|---|---|---|---|
| 7,408,212 | B1 * | 8/2008 | Luan | ..................... G11C 13/003 |
| | | | | 257/295 |
| 8,120,951 | B2 * | 2/2012 | Mouli | ................. G11C 11/5664 |
| | | | | 365/163 |
| 9,923,027 | B2 | 3/2018 | Chiu et al. | |
| 2010/0044670 | A1 | 2/2010 | Ling | |
| 2011/0133149 | A1 | 6/2011 | Sonehara | |

(Continued)

FOREIGN PATENT DOCUMENTS

| | | |
|---|---|---|
| CN | 101477987 A | 7/2009 |
| CN | 101882617 A | 11/2010 |

(Continued)

*Primary Examiner* — David Vu
(74) *Attorney, Agent, or Firm* — Huan-Yi Lin

(57) ABSTRACT

A non-volatile memory device includes: an insulation layer; a Schottky diode, which is formed on the insulation layer; a writing wire which is conductive and is electrically connected to a first end of the Schottky diode; a memory unit on the Schottky diode, the memory unit being electrically connected to a second end of the Schottky diode; and a selection wire on the memory unit, the selection wire being electrically connected to the memory unit; wherein when the non-volatile memory device is selected for a data to be written into, a first current flows through the Schottky diode to write the data into the memory unit.

28 Claims, 31 Drawing Sheets

(56) References Cited

U.S. PATENT DOCUMENTS

| 2011/0215436 | A1 | 9/2011 | Tang et al. |
| 2017/0301730 | A1 | 10/2017 | Cao et al. |
| 2021/0043683 | A1 | 2/2021 | Chiang et al. |

FOREIGN PATENT DOCUMENTS

| CN | 101976677 | A | 2/2011 |
| CN | 102280465 | A | 12/2011 |
| CN | 107301875 | A | 10/2017 |

* cited by examiner

50

56

55

53a

57

54

52

N

53 { 53a
      53b

51

53b

| | 841 | 842 | 86 | Write wire of unselected non-volatile memory device | Select wire of unselected non-volatile memory device |
|---|---|---|---|---|---|
| Write "0" | Vw | Floating | 0 | Floating | Floating |
| Write "1" | Floating | 0 | Vw | Floating | Floating |
| Read | Floating | Sense | Vr | Floating | Floating |

| | 942 | 971 | 96 | 942, 971 of unselected non-volatile memory device | 96 of unselected non-volatile memory device |
|---|---|---|---|---|---|
| Write "0" | Vw | Floating | 0 | Floating | Floating |
| Write "1" | Floating | 0 | Vw | Floating | Floating |
| Read | Floating | Sense | Vr | Floating | Floating |

Fig. 9C

| | 116 | 1173 | 1172 | 1142 | 1141 | Bit line of unselected non-volatile memory device | Read selection wire of unselected non-volatile memory device |
|---|---|---|---|---|---|---|---|
| Write "0" | Floating | Floating | 0 | Floating | Vw | Floating | Floating |
| Write "1" | Floating | 0 | Floating | Vw | Floating | Floating | Floating |
| Read | Sense | Floating | Floating | Vr | Floating | Floating | Floating |

Fig. 11B

Schottky Diode

NON-VOLATILE MEMORY DEVICE HAVING SCHOTTKY DIODE

CROSS REFERENCE

The present invention claims priority to TW 110110254 filed on Mar. 22, 2021.

BACKGROUND OF THE INVENTION

Field of Invention

The present invention relates to a non-volatile memory device; particularly, it relates to such non-volatile memory device having a Schottky diode as a selector.

Description of Related Art

Please refer to FIG. 1A and FIG. 1B, which show a cross-sectional diagram and a three-dimensional diagram of a conventional phase change random access memory (PCRAM) device 10, respectively. The PCRAM device 10 is a type of non-volatile memory device and can be applied in an electronic circuit to store data. When the electronic circuit is turned OFF and there is no power, the data can still be kept in a phase change area of the PCRAM device 10 without lost.

As shown in FIG. 1A and FIG. 1B, the PCRAM device 10 is formed on a substrate 11. The PCRAM device 10 includes: a source/drain 12, a bi-directional selector 13, metal plugs 141 and 142, a phase change area 15, a ground wire 16 and a bit wire 17. An addressing operation by the bi-directional selector 13 and the bit wire 17 determines a specific address of the phase change area 15 of the PCRAM device 10, so as to write data into the address. To be more specific, a channel between the source/drain 12 can be conducted through controlling the bi-directional selector 13, whereby a current is controlled to flow from the metal plug 141, through the source/drain 12, the above-mentioned channel between the source/drain 12, the metal plug 142 and the phase change area 15, to ground wire 16; this current is controlled by controlling a voltage of the bit wire 17, so as to change a crystallization status of the material in the phase change area 15. Different crystallization statuses result in different resistances of the phase change area 15, which can be used to indicate different stored data. The material in the phase change area 15 for example can be a GeSbTe (GST) alloy; the GST alloy has different resistances in its crystallization status and amorphous status. The PCRAM device 10 can write a data indicative of "1" or "0" into the phase change area 15 through the above-mentioned addressing operation and resistance-changing operation, which is well known to those skilled in the art, so the details thereof are not redundantly explained here.

Please refer to FIG. 2A and FIG. 2B, which show a cross-sectional diagram and a three-dimensional diagram of a conventional spin transfer torque (STT) type magnetoresistive random access memory (MRAM) device 20, respectively. The STT type MRAM (abbreviated as "STT-MRAM") device 20 is a type of MRAM device and is also a type of non-volatile memory device, which can be applied in an electronic circuit to store data. When the electronic circuit is turned OFF and there is no power, the data can still be kept in a magnetic area of the MRAM device 20 without lost. The STT-MRAM device 20 includes: a top electrode and a bottom electrode, both of which are made of ferromagnetic material; and an oxide layer (e.g., a magnesium oxide layer) interposed between the top electrode and the bottom electrode. In a case where a magnetization orientation between the top ferromagnetic layer and the bottom ferromagnetic layer (i.e., the top electrode and the bottom electrode) changes from a parallel orientation to an antiparallel orientation, the resistance of the MRAM device will become relatively larger. On the contrary, in a case where the magnetization orientation between the top ferromagnetic layer and the bottom ferromagnetic layer (i.e., the top electrode and the bottom electrode) changes from an anti-parallel orientation to a parallel orientation, the resistance of the STT-MRAM device 20 will become relatively smaller. In light of this, by different resistances of the magnetic area, the STT-MRAM device 20 can indicate different stored data.

As shown in FIG. 2A and FIG. 2B, the STT-MRAM device 20 is formed on a substrate 21. The STT-MRAM device 20 includes: a source/drain 22, a bi-directional selector 23, metal plugs 241 and 242, a magnetic area 25, connection wires 261 and 262 and a bit wire 27. An addressing operation by the bi-directional selector 23 and the bit wire 27 determines a specific address of the magnetic area 25 of the STT-MRAM device 20, so as to write data into the address. To be more specific, a channel between the source/drain 22 can be conducted through controlling the bi-directional selector 23, whereby a current is controlled to flow from the magnetic area 25, through the connection wire 261, the metal plug 241, the source/drain 22, the above-mentioned channel between the source/drain 22 and the metal plug 142, to the connection wire 262; this current is controlled by controlling a voltage of the bit wire 27, so as to change a magnetization orientation of the material in the magnetic area 25. As described above, different magnetization orientations between the top ferromagnetic layer and the bottom ferromagnetic layer can cause the magnetic area 25 to have different resistances, which can be used to indicate different stored data. The material in the magnetic area 25 for example can be a CoFe alloy or a CoFeB alloy. The STT-MRAM device 20 can write a data indicative of "1" or "0" into the magnetic area 25 through the above-mentioned mechanism, which is well known to those skilled in the art, so the details thereof are not redundantly explained here.

Please refer to FIG. 3A and FIG. 3B, which show a cross-sectional diagram and a three-dimensional diagram of a conventional resistive random access memory (RRAM) device 30, respectively. The RRAM device 30 is a type of non-volatile memory device and can be applied in an electronic circuit to store data. When the electronic circuit is turned OFF and there is no power, the data can still be kept in a resistance change area of the RRAM device 30 without lost.

As shown in FIG. 3A and FIG. 3B, the RRAM device 30 is formed on a substrate 31. The RRAM device 30 includes: a source/drain 32, a bi-directional selector 33, metal plugs 341 and 342, a resistance change area 35, a ground wire 36 and a bit wire 37. An addressing operation by the bi-directional selector 33 and the bit wire 37 determines a specific address of the resistance change area 35 of the RRAM device 30, so as to write data into the address. To be more specific, a channel between the source/drain 32 can be conducted through controlling the bi-directional selector 33, whereby a current is controlled to flow from the metal plug 341, through the source/drain 32, the above-mentioned channel between the source/drain 32, the metal plug 342, and the resistance change area 35, to ground wire 36; this current can be controlled through controlling a voltage of the bit wire 37, so as to change a resistance in the resistance change area 35, whereby the resistance change area 35 can have different resistances to indicate different stored data. The resistance change area 35 includes two metal layers and a dielectric layer which separates the two metal layers from each other. The material in the metal layers for example can be a copper telluride (CuTe) alloy or a copper germanium (CuGe) alloy. The RRAM device 30 can write a data indicative of "1" or "0" into the resistance change area 35 through the above-mentioned addressing operation and resistance-changing operation, which is well known to those skilled in the art, so the details thereof are not redundantly explained here.

In a conventional non-volatile memory device, a selector which operates for writing data into a data storage cell is a bi-directional switch, such as the above-mentioned bi-directional selectors 13, 23 and 33; the above-mentioned bi-directional selectors 13, 23 and 33 are typically made of a metal oxide semiconductor (MOS) device. This results in at least the following drawbacks: first, the MOS device is required to have a source, a gate and a drain, so the area occupied by the MOS device is larger as compared to a diode (e.g., a Schottky diode). As a result, the conventional non-volatile memory device is fundamentally inferior to shrink its size. Second, because the MOS device has a saturation region, its conduction current is lower as compared to a diode (e.g., a Schottky diode), i.e., the conduction current of the MOS device is limited by its electric characteristics. Taking an MRAM device as an example, in a case where a bi-directional selector is made of a MOS device, a current to write data into a magnetic area needs to reach a level of $10^7$ A/cm$^2$. To reach such level of $10^7$ A/cm$^2$, as compared to a Schottky diode, the area required for the MOS device will be tremendously larger. Lastly, a channel of the MOS device formed in a semiconductor substrate has a relatively larger leakage current. Thus, the conventional non-volatile memory device using a MOS device as a bi-directional selector is disadvantageous in shrinking size and in increasing current per unit area.

Another relevant prior art of which the inventor is aware is a 90 nm PCRAM device having 512 MB memory, disclosed by J. H. Oh et al. in "DOI No.: 10.1109/IEDM.2006346905". This prior art discloses a PCRAM device manufactured by a standard CMOS manufacturing process. The manufacturing process steps for this prior art PCRAM device include: first, an epitaxial silicon layer is formed on a silicon substrate heavily doped by N-conductivity type impurities. Second, a Schottky diode is formed in the epitaxial silicon layer, to serve as a selector of the prior art PCRAM device. In this prior art PCRAM device, because the Schottky diode is formed in the epitaxial silicon layer, its conduction resistance is higher than the conduction resistance of a case wherein the Schottky diode is formed in a monocrystalline silicon layer. Besides, the silicon substrate heavily doped cannot be effectively insulated from other devices, so this prior art PCRAM device will undesirably have a larger leakage current. Moreover, the size of this prior art PCRAM device is difficult to be shrunk.

In view of the above, to overcome the drawbacks in the prior art, the present invention proposes a non-volatile memory device having a Schottky diode, which occupies less area and provides higher current t per unit area. Consequently and desirably, the application range of such non-volatile memory device is greatly broadened.

SUMMARY OF THE INVENTION

From one perspective, the present invention provides a non-volatile memory device, comprising: an insulation layer, which is electrically insulative; a first Schottky diode, which is formed on the insulation layer, wherein a cathode of the first Schottky is formed in a monocrystalline semiconductor layer; a first writing wire which is conductive, wherein the first writing wire is electrically connected to a first end of the first Schottky diode; a memory unit, which is located on the first Schottky diode, wherein the memory unit is electrically connected to a second end of the first Schottky diode; and a selection wire which is conductive, wherein the selection wire is located on the memory unit and is electrically connected to the memory unit; wherein in a case where the non-volatile memory device is selected for a first data to be written into, a first current flows through the first Schottky diode, so as to write the first data into the memory unit; wherein the cathode of the first Schottky diode is the first end of the first Schottky diode or the second end of the first Schottky diode.

From another perspective, the present invention provides a non-volatile memory circuit, comprising: a non-volatile memory device array including a plurality of non-volatile memory devices; and a control circuit configured to operably control the non-volatile memory device array so as to read from or write into the non-volatile memory devices; wherein the non-volatile memory device includes: an insulation layer, which is electrically insulative; a first Schottky diode, which is formed on the insulation layer, wherein a cathode of the first Schottky is formed in a monocrystalline semiconductor layer; a first writing wire which is conductive, wherein the first writing wire is electrically connected to a first end of the first Schottky diode; a memory unit, which is located on the first Schottky diode, wherein the memory unit is electrically connected to a second end of the first Schottky diode; and a selection wire which is conductive, wherein the selection wire is located on the memory unit and is electrically connected to the memory unit; wherein in a case where the non-volatile memory device is selected for a first data to be written into, a first current flows through the first Schottky diode, so as to write the first data into the memory unit; wherein the cathode of the first Schottky diode is the first end of the first Schottky diode or the second end of the first Schottky diode.

In one embodiment, the first Schottky diode is stacked and connected on the insulation layer.

In one embodiment, the first writing wire is stacked and connected on the insulation layer, and the first Schottky diode is stacked and connected on the first writing wire.

In one embodiment, the non-volatile memory device further comprises: a second Schottky diode, which is formed on the insulation layer, wherein a cathode of the second Schottky diode is formed in the monocrystalline semiconductor layer; and a second writing wire which is conductive, wherein the second writing wire is electrically connected to a first end of the second Schottky diode; wherein in a case where the non-volatile memory device is selected for a second data to be written into, a second current flows through the second Schottky diode, so as to write the second data into the memory unit; wherein the memory unit is electrically connected to a second end of the second Schottky diode; wherein the cathode of the second Schottky diode is the first end of the second Schottky diode or the second end of the second Schottky diode.

In one embodiment, the second Schottky diode is stacked and connected on the insulation layer.

In one embodiment, the second writing wire is stacked and connected on the insulation layer, and the second Schottky diode is stacked and connected on the second writing wire.

In one embodiment, the non-volatile memory device further comprises: a first connection conduction unit, which is configured to electrically connect the memory unit to the second end of the first Schottky diode, wherein a portion of the first connection conduction unit is stacked and connected on the second end of the first Schottky diode; and a second connection conduction unit, which is configured to electrically connect the first connection conduction unit to the second end of the second Schottky diode, so that the memory unit is electrically connected to the second end of the second Schottky diode; wherein the first writing wire is stacked and connected on the insulation layer, and wherein the first end of the first Schottky diode is stacked and connected on the first writing wire, and wherein the second end of the first Schottky diode is stacked and connected on the first end of the first Schottky diode; wherein a first portion of the second connection conduction unit is stacked and connected on the insulation layer, and wherein a second portion of the second connection conduction unit is stacked and connected on the first portion of the second connection conduction unit, and wherein another portion of the first connection conduction unit is stacked and connected on the second portion of the second connection conduction unit; wherein the second end of the second Schottky diode is stacked and connected on the first portion of the second connection conduction unit, and wherein the first end of the second Schottky diode is stacked and connected on the second end of the second Schottky diode, and wherein the second writing wire is stacked and connected on the first end of the second Schottky diode; wherein the first writing wire and the first portion of the second connection conduction unit are formed by one same metal line formation process.

In one embodiment, the non-volatile memory device further comprises: a first connection conduction unit, which is electrically connected between the first Schottky diode and the memory unit, wherein the first connection conduction unit is configured to electrically connect the memory unit to the second end of the first Schottky diode.

In one embodiment, the non-volatile memory device further comprises: a second connection conduction unit, which is electrically connected between the second Schottky diode and the memory unit, wherein the second connection conduction unit is configured to electrically connect the memory unit to the second end of the second Schottky diode.

In one embodiment, the non-volatile memory device is a phase change random access memory (PCRAM)), a magnetoresistive random access memory (MRAM) or a resistive random access memory (RRAM).

In one embodiment, the first writing wire is a metal wire.

In one embodiment, the first writing wire and the second writing wire are both metal wires.

In one embodiment, the non-volatile memory device is formed on a semiconductor-on-insulator (SOI) substrate or a semiconductor-metal-on-insulator (SMOI) substrate.

In one embodiment, the first connection conduction unit and the second writing wire are formed by one same metal line formation process.

In one embodiment, the monocrystalline semiconductor layer includes a monocrystalline silicon layer, a monocrystalline germanium layer, a hexagonal boron nitride layer or a monocrystalline gallium arsenide layer.

The objectives, technical details, features, and effects of the present invention will be better understood with regard to the detailed description of the embodiments below, with reference to the attached drawings.

6

BRIEF DESCRIPTION OF THE DRAWINGS

FIG. 8A and FIG. 8B respectively show a cross-sectional diagram and a three-dimensional diagram of a non-volatile memory device according to an embodiment of the present invention, while, FIG. 8C shows an operation table corresponding to an operation of FIG. 8A and FIG. 8B.

FIG. 9A and FIG. 9B respectively show a cross-sectional diagram and a three-dimensional diagram of a non-volatile memory device according to an embodiment of the present invention, while, FIG. 9C shows an operation table corresponding to an operation of FIG. 9A and FIG. 9B.

FIG. 11A shows a three-dimensional diagram of a non-volatile memory device according to an embodiment of the present invention, while, FIG. 11B shows an operation table corresponding to an operation of FIG. 11A.

DESCRIPTION OF THE PREFERRED EMBODIMENTS

The drawings as referred to throughout the description of the present invention are for illustration only, to show the interrelations among the layers of the device configuration, while the shapes, thicknesses, and widths are not drawn in actual scale.

Figure 1A:
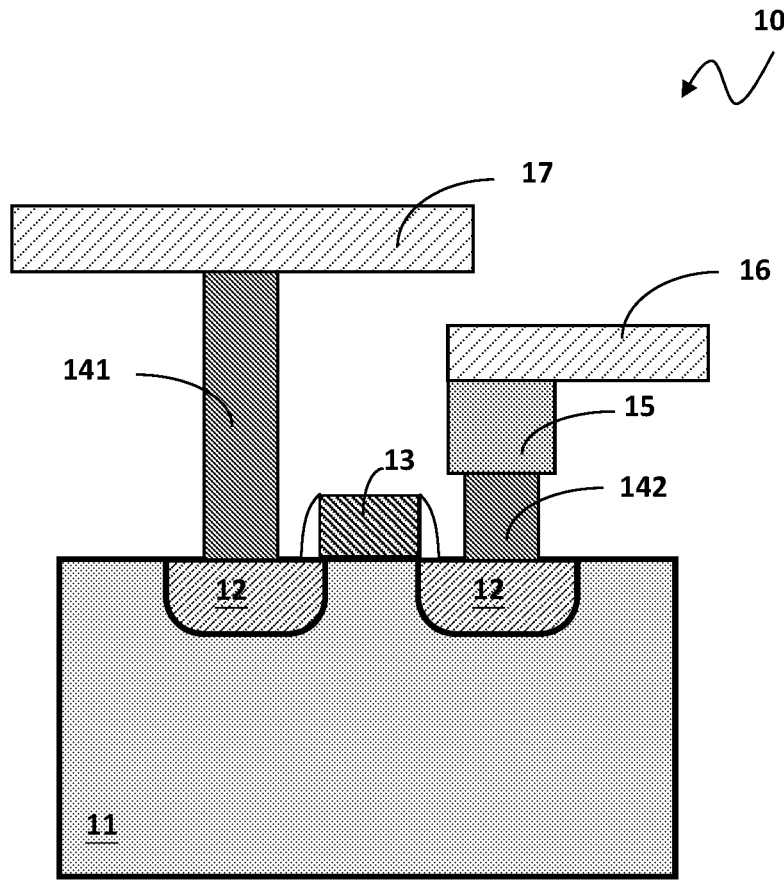
FIG. 1A and FIG. 1B show a cross-sectional diagram and a three-dimensional diagram of a conventional phase change random access memory (PCRAM) device 10, respectively.
Figure 1B:
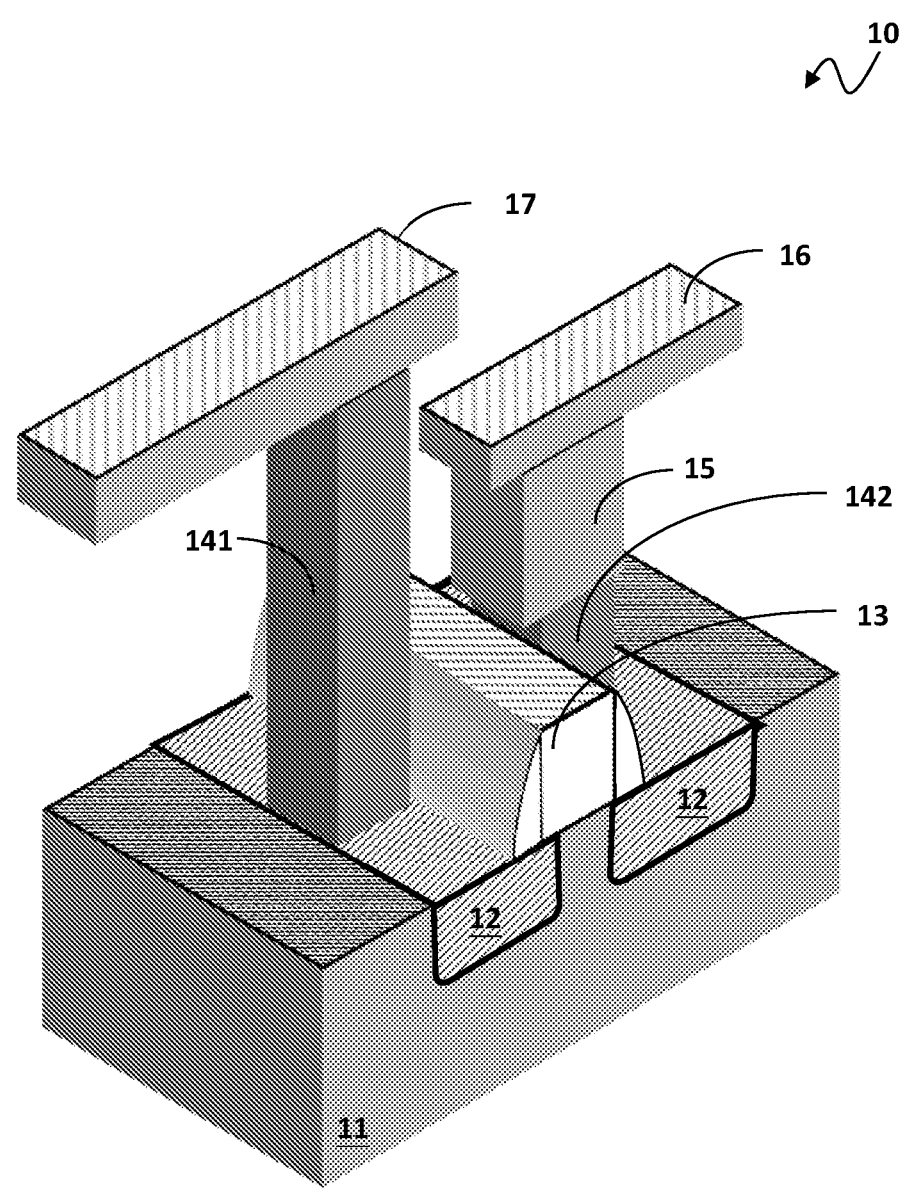
Figure 2A:
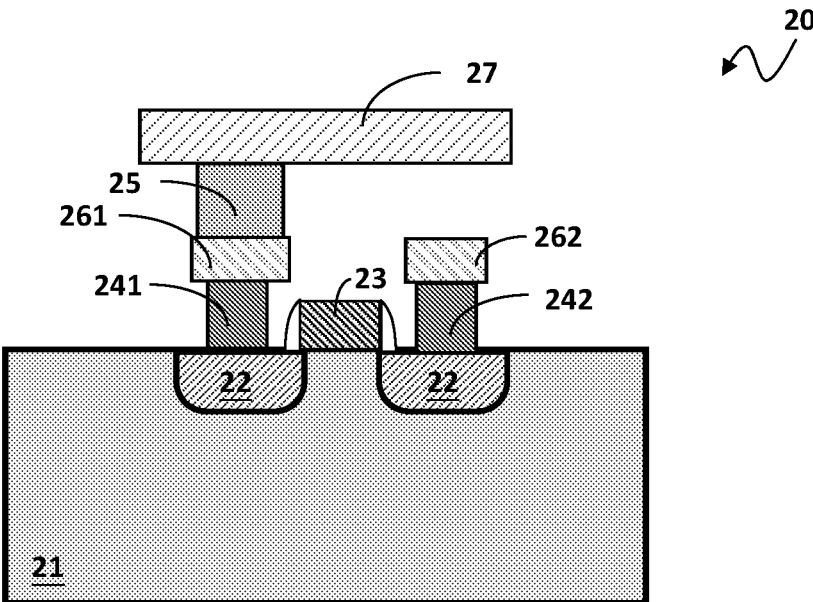
FIG. 2A and FIG. 2B show a cross-sectional diagram and a three-dimensional diagram of a conventional spin transfer torque (STT) type magnetoresistive random access memory (MRAM) device 20, respectively.
Figure 2B:
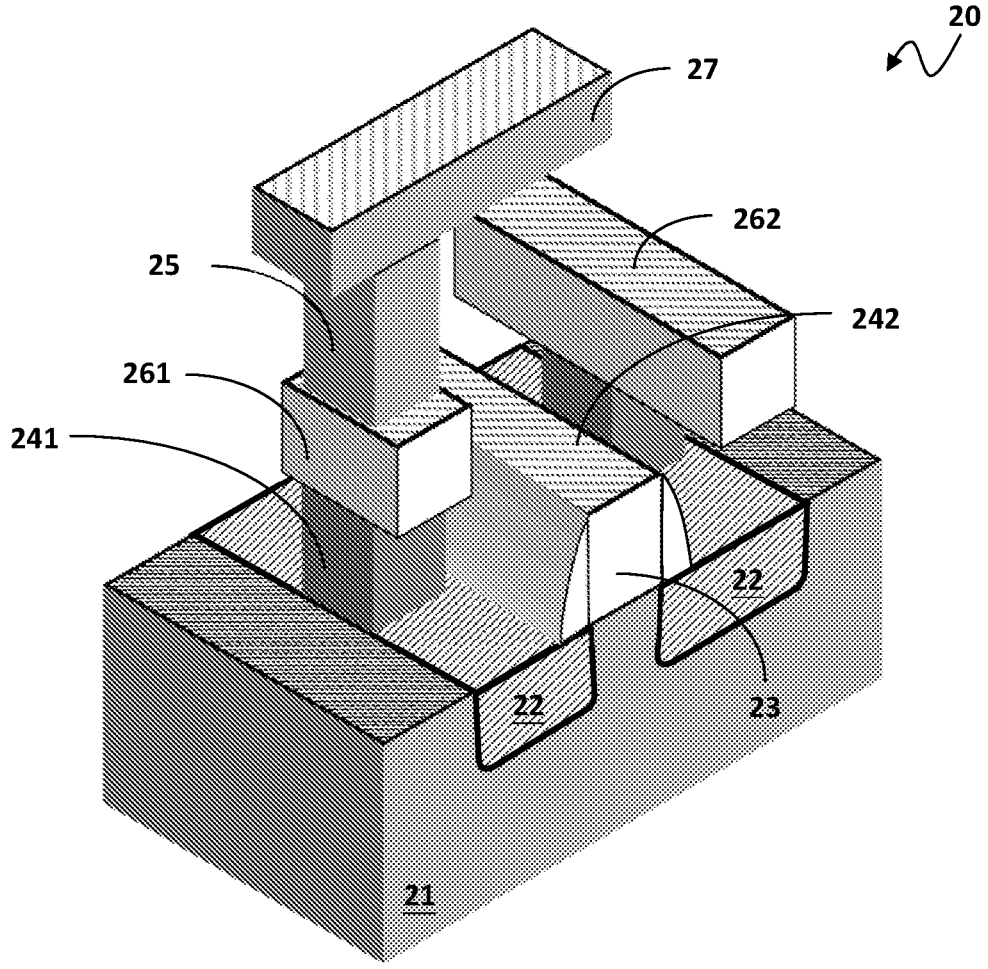
Figure 3A:
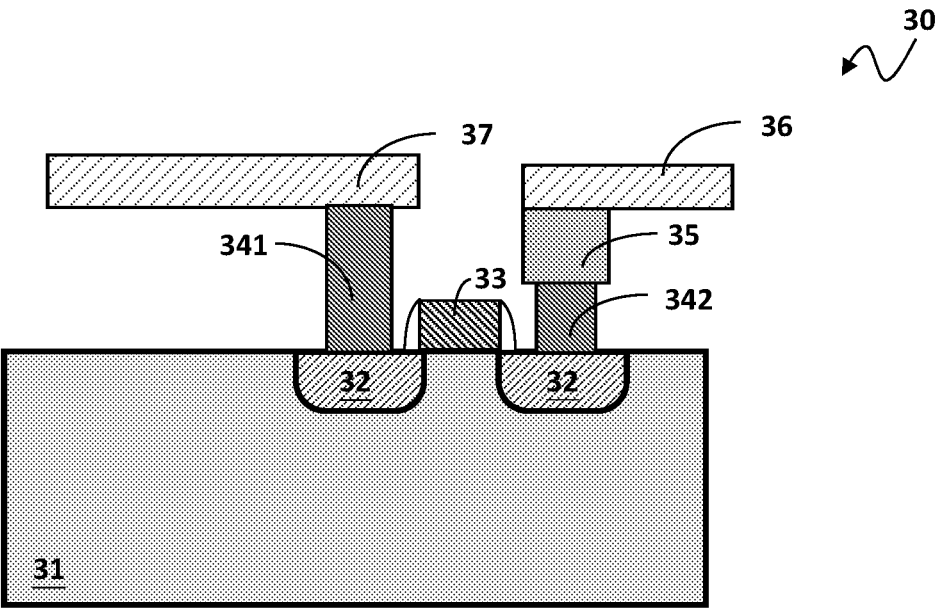
FIG. 3A and FIG. 3B show a cross-sectional diagram and a three-dimensional diagram of a conventional resistive random access memory (RRAM) device 30, respectively.
Figure 3B:
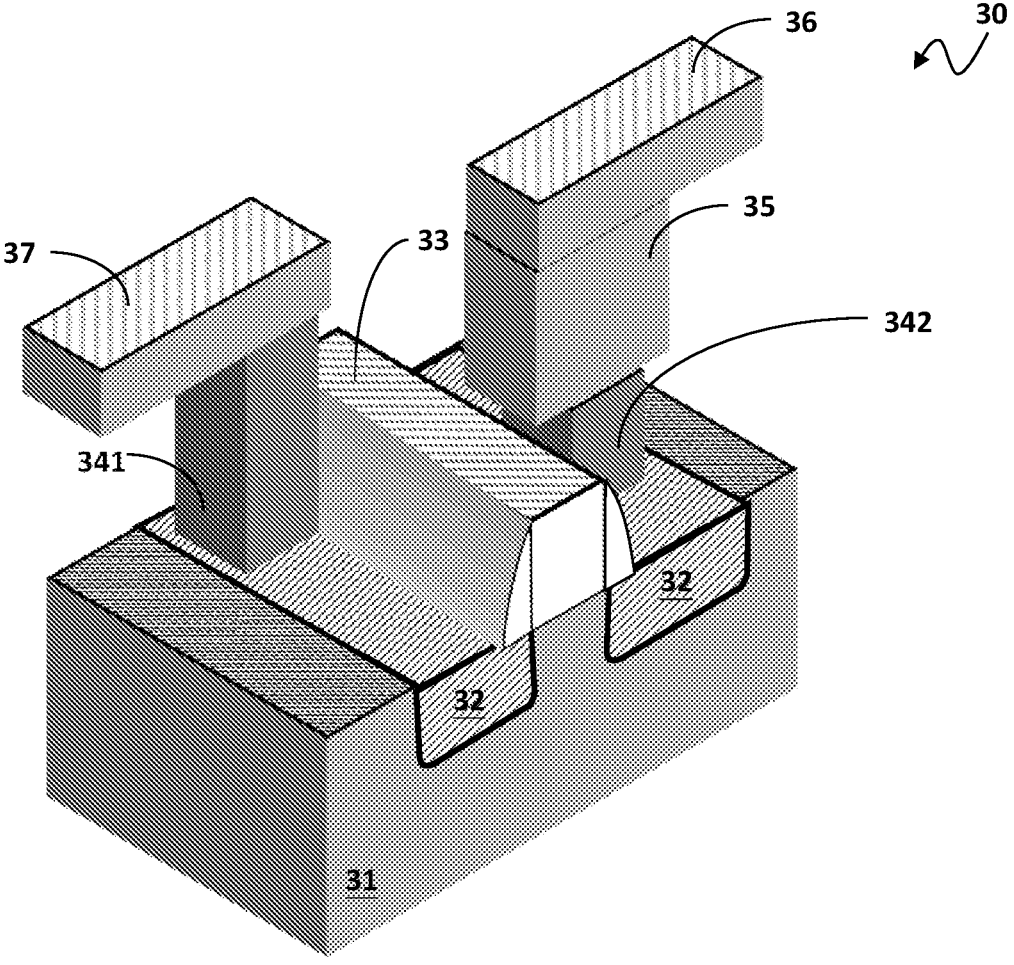
Figure 4A:
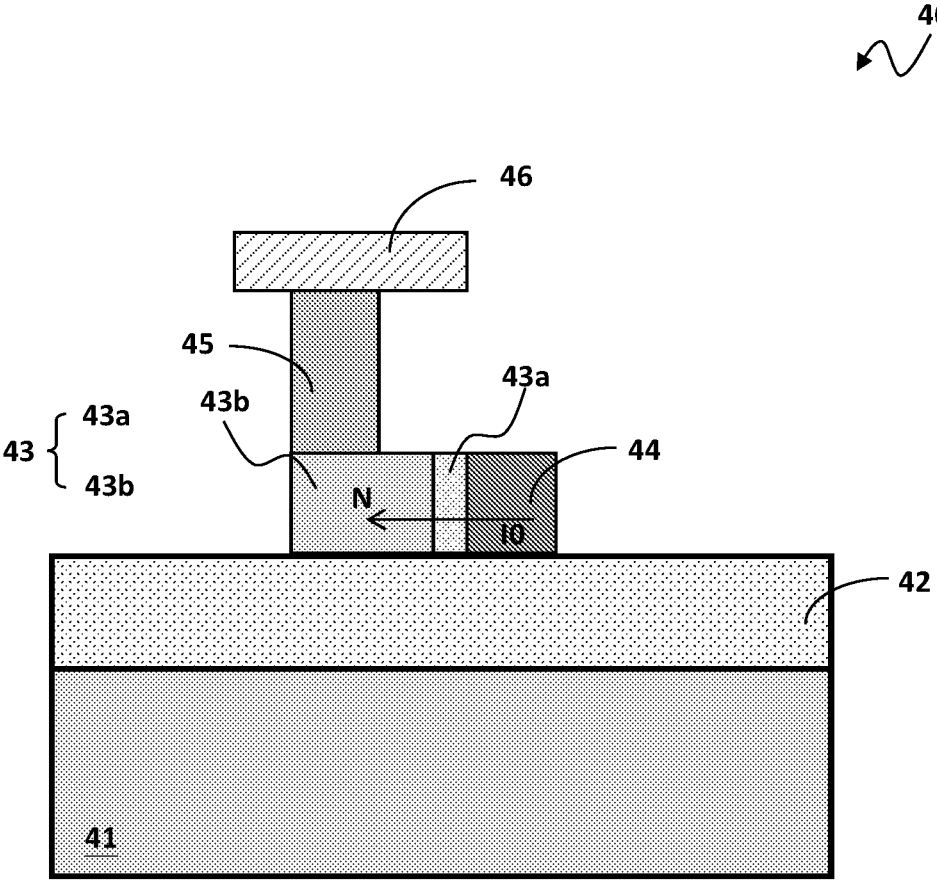
FIG. 4A and FIG. 4B respectively show a cross-sectional diagram and a three-dimensional diagram of a non-volatile memory device according to an embodiment of the present invention.
Figure 4B:
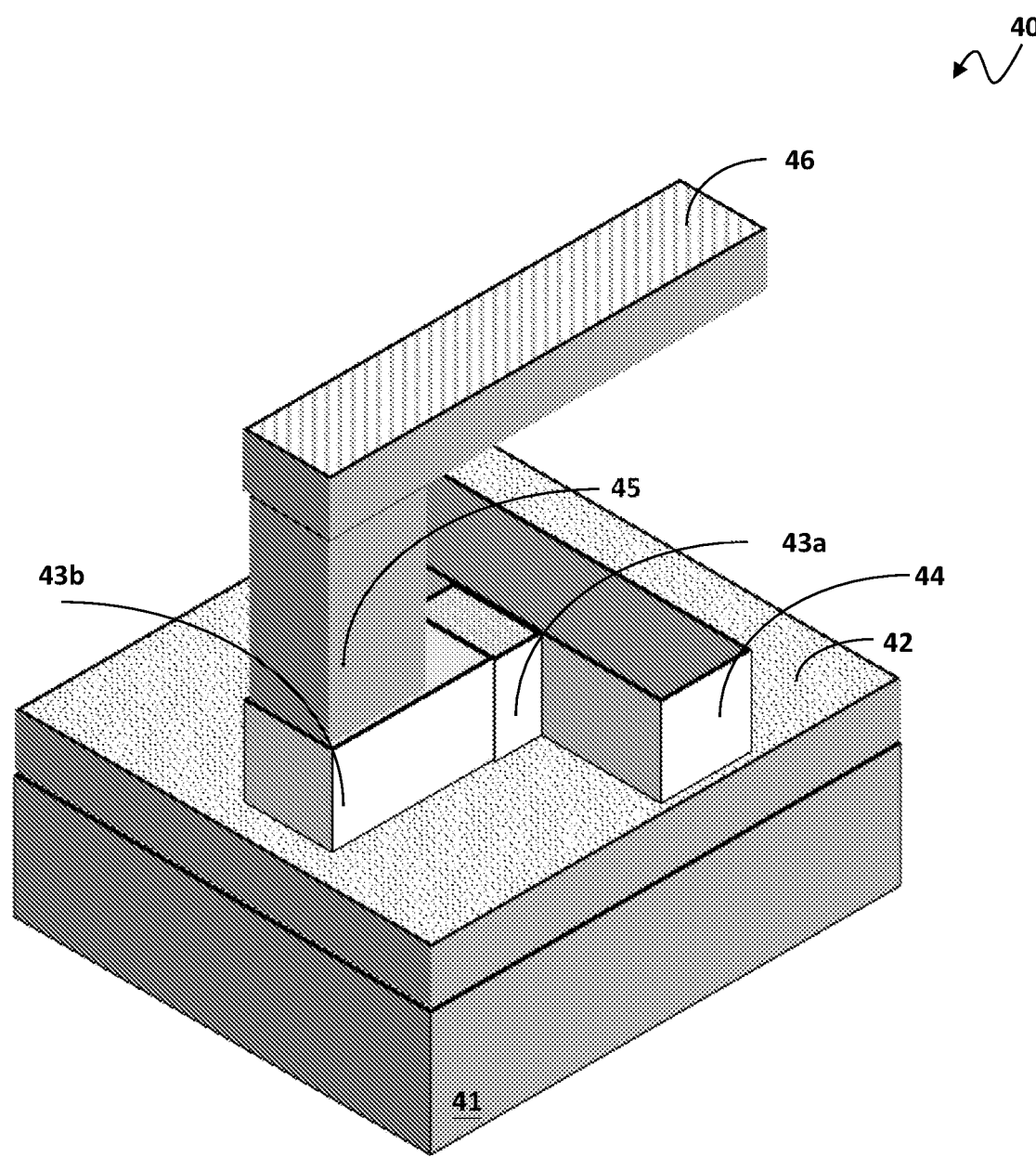

Please refer to FIG. 4A and FIG. 4B, which respectively show a cross-sectional diagram and a three-dimensional diagram of a non-volatile memory device according to an embodiment of the present invention. A non-volatile memory device 40 according to the present invention is formed on a semiconductor substrate 41. The non-volatile memory device 40 includes: an insulation layer 42, a Schottky diode 43, a writing wire 44, a memory unit 45 and a selection wire 46. The insulation layer 42 is formed on the semiconductor substrate 41, wherein the insulation layer 42 is electrically insulative. The Schottky diode 43 has a first end 43*a* as an anode and a second end 43*b* as a cathode, wherein the second end 43*b* is formed in a monocrystalline semiconductor layer on the insulation layer 42, wherein the monocrystalline semiconductor layer includes for example a monocrystalline silicon layer, a monocrystalline germanium layer, a hexagonal boron nitride layer or a monocrystalline gallium arsenide layer on the insulation layer 42. The second end 43*b* of the Schottky diode 43 can be formed by, for example but not limited to, an ion implantation process step which implants N-conductivity type impurities (or P-conductivity type impurities, but N-conductivity type impurities are preferred) in a region which defines the second end 43*b* of the Schottky diode 43 in the form of accelerated ions. The first end 43*a* (a metal end) and the second end 43*b* form a Schottky contact, so as to form the Schottky diode 43. The writing wire 44 is conductive and the writing wire 44 is electrically connected to the anode end 43*a* (i.e., metal end in this embodiment) of the Schottky diode 43. The Schottky diode 43 has a characteristic of one-way conduction. The memory unit 45 is located on the Schottky diode 43. The memory unit 45 is electrically connected to the second end 43*b* (i.e., N-conductivity type semiconductor end in this embodiment) of the Schottky diode 43. The selection wire 46 is conductive, wherein the selection wire 46 is located on the memory unit 45 and is electrically connected to the memory unit 45. In a case where the non-volatile memory device 40 is selected for a data to be written into, a first current I0 flows through the Schottky diode 43, so as to write the data into the memory unit 45.

An addressing operation by the selection wire 46 and the writing wire 44 determines a specific address of the memory unit 45, so as to write data into the address of. That is, by adjusting a voltage level of the selection wire 46 and a voltage level of the writing wire 44 to conduct the Schottky diode 43, the first current I0 flows from the writing wire 44, through the Schottky diode 43 and the memory unit 45, to the selection wire 46, so as to write data into the memory unit 45. According to the present invention, the memory unit 45 can be a phase change area of a PCRAM device, a magnetic area of an MRAM device or a resistance change area of a RRAM device. The "data" can be, for example but not limited to, an electric characteristic indicative of "1" or "0". Such electric characteristic can be, for example but not limited to, a crystallization status, a magnetization orientation, or a resistance of a material.

As described above, the Schottky diode includes an anode formed in a metal layer and a cathode formed in a semiconductor layer; however for the convenience of describing the structure along a logical direction, hereinafter the terms "first end" and "second end" will be used, wherein the "first end" described in this patent specification can be the anode or the cathode, and the "second end" described in this patent specification can correspondingly be the cathode or the anode, wherein the first end and the second end form a Schottky contact. In addition, the anode and the cathode of the Schottky diode are connected to other wires through ohmic contacts, wherein the wires can be, for example, writing wires, selection wires, transmission wires, connection wires or conduction units, etc., which are known by those skilled in this art and therefore are not described in detail herein.

Figure 4C:
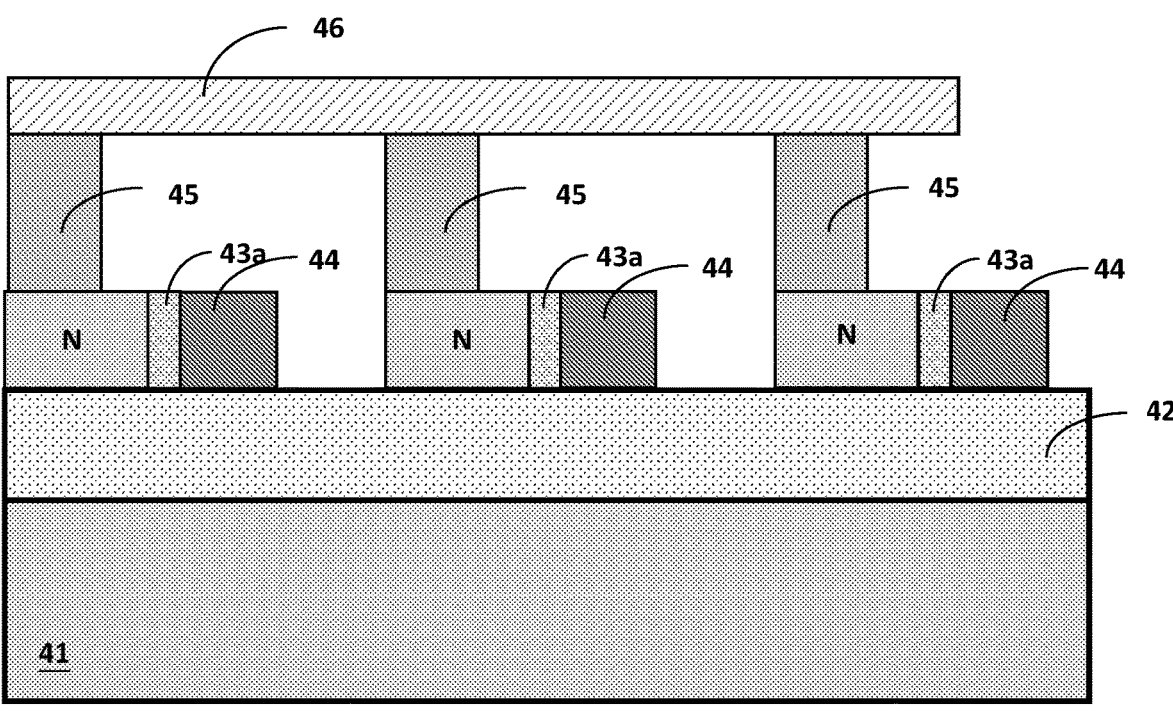
FIG. 4C shows a cross-sectional diagram, which illustrates an embodiment as to how plural non-volatile memory devices 40 of FIG. 4A and FIG. 4B can be arranged to connect to one selection wire 46.

Please refer to FIG. 4C, which shows a cross-sectional diagram, illustrating an embodiment as to how plural non-volatile memory devices 40 of FIG. 4A and FIG. 4B can be arranged to connect to one selection wire 46. As shown in FIG. 4C, in one embodiment, plural non-volatile memory devices 40 can be arranged along one same selection wire 46 in consecutive fashion. Thus, when there are plural selection wires 46, a non-volatile memory device array is formed by plural non-volatile memory devices 40 arranged by rows and columns.

Figure 4D:
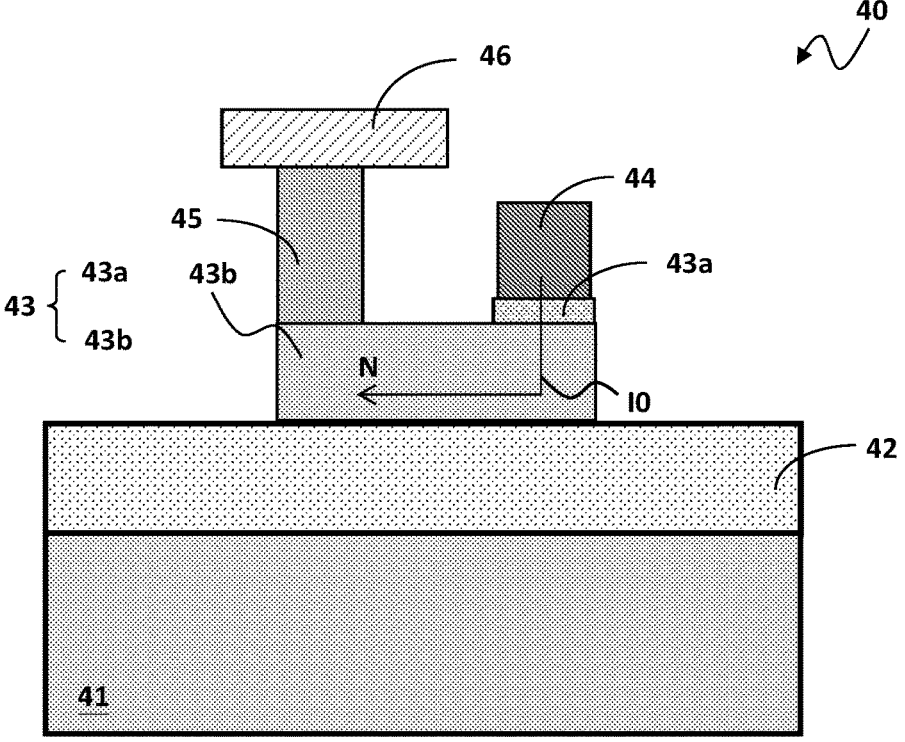
FIG. 4D shows a cross-sectional diagram of a non-volatile memory device according to an embodiment of the present invention.

Please refer to FIG. 4D, which shows a cross-sectional diagram of a non-volatile memory device according) an embodiment of the present invention. This embodiment of FIG. 4D is different from the embodiment of FIG. 4A and FIG. 4B in that: in this embodiment, the writing wire 44 is stacked and connected on the first end 43*a* (i.e., metal end in this embodiment) of the Schottky diode 43, which is different from the writing wire 44 in the embodiment of FIG. 4A wherein the writing wire 44 is electrically connected to the first end 43*a* of the Schottky diode 43 along a horizontal direction. That is, the writing wire 44 can be electrically connected to the first end 43*a* of the Schottky diode 43 at its lateral side along a horizontal direction, as shown in FIG. 4A; or, the writing wire 44 can be electrically connected to the first end 43*a* of the Schottky diode 43 along a vertical direction, as shown in FIG. 4D.

Figure 4E:
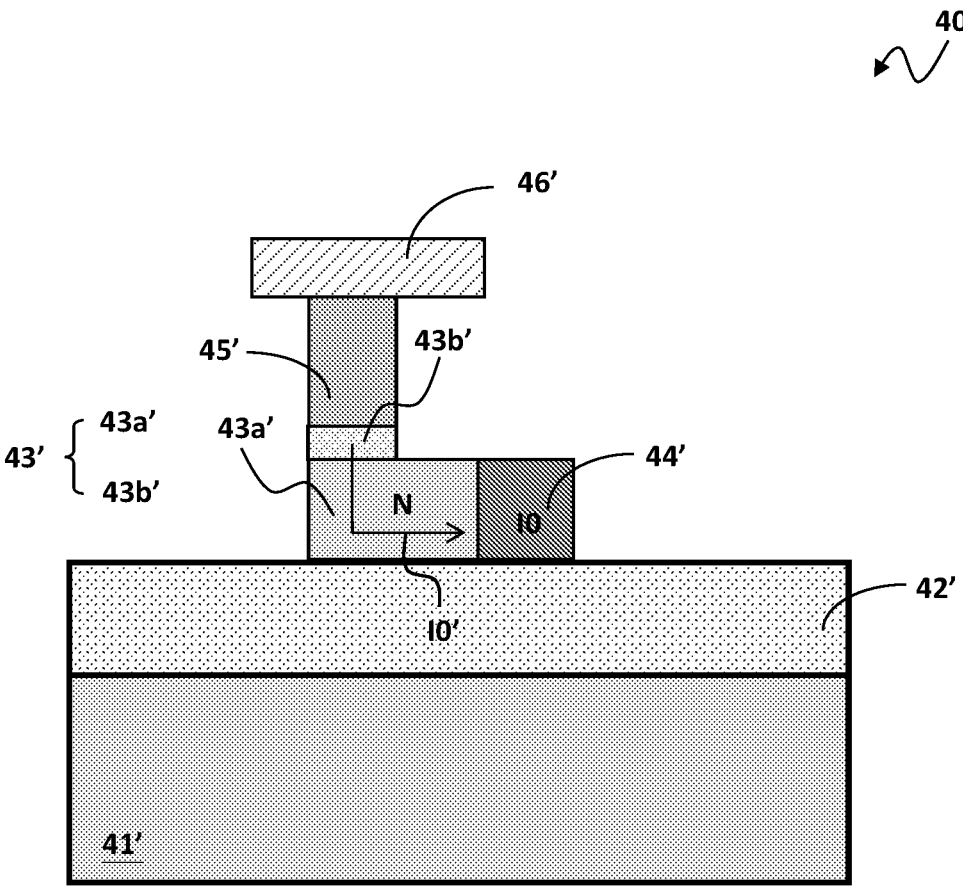
FIG. 4E shows a cross-sectional diagram of a non-volatile memory device according to an embodiment of the present invention.

Please refer to FIG. 4E, which shows a cross-sectional diagram of a non-volatile memory device according to an embodiment of the present invention. A non-volatile memory device 40' according to the present invention is formed on a semiconductor substrate 41'. The non-volatile memory device 40' includes: an insulation layer 42', a Schottky diode 43', a writing wire 44', a memory unit 45' and a selection wire 46'. The insulation layer 42' is formed on the semiconductor substrate 41', wherein the insulation layer 42' is electrically insulative. The Schottky diode 43' has a second end 43*b'* as an anode and a first end 43*a'* as a cathode, wherein the first end 43*a'* and the second end 43*b'* form a Schottky contact. The first end 43*a'* is formed in a monocrystalline semiconductor layer on the insulation layer 42', wherein the monocrystalline semiconductor layer includes for example a monocrystalline silicon layer, a monocrystalline germanium layer, a hexagonal boron nitride layer or a monocrystalline gallium arsenide layer. The first end 43a' of the Schottky diode 43' can be formed by, for example but not limited to, an ion implantation process step which implants N-conductivity type impurities (or P-conductivity type impurities, but N-conductivity type impurities are preferred) in the first end 43a' of the Schottky diode 43 in the form of accelerated ions, to form a Schottky contact with the second end 43b', so as to form the Schottky diode 43'. The writing wire 44' is conductive and the writing wire 44' is electrically connected to the first end 43a' (i.e., an N-conductivity type semiconductor end in this embodiment) of the Schottky diode 43'. The memory unit 45' is located on the Schottky diode 43'. The memory unit 45' is electrically connected to the second end 43b' (i.e., metal end in this embodiment) of the Schottky diode 43'. The selection wire 46' is conductive, wherein the selection wire 46' is located on the memory unit 45' and is electrically connected to the memory unit 45'. In a case where the non-volatile memory device 40' is selected for a data to be written into, a first current I0' flows through the Schottky diode 43', so as to write the data into the memory unit 45'.

This embodiment is different from the embodiment shown in FIGS. 4A and 4B in that, in this embodiment, the first end 43a' is the N-conductivity type semiconductor end and the second end 43b' is the metal end, whereas the first end 43a is a metal end and the second end 43b is an N-conductivity type semiconductor end in the embodiment shown in FIG. 4A. This embodiment indicates that the direction of the conduction current and the direction of the Schottky contact can be different to form different Schottky diodes for use in different non-volatile memory devices, according to the present invention.

Figure 4F:
FIG. 4F shows a schematic diagram of a non-volatile memory circuit according to an embodiment of the present invention.

FIG. 4F shows a schematic diagram of a non-volatile memory circuit according to an embodiment of the present invention. As shown in FIG. 4F and also referring to FIGS. 4A-4C, the non-volatile memory circuit 4 includes: a non-volatile memory device array 400 including plural non-volatile memory devices 40; and a control circuit 410 controlling the non-volatile memory device array 400 so as to read from or write into the non-volatile memory devices 40; wherein the non-volatile memory device 40, as shown by FIGS. 4A-4C, includes: an insulation layer 42, which is electrically insulative; a Schottky diode 43, which has a first end 43a as an anode and a second end 43b as a cathode, wherein the second end 43b is formed in a monocrystalline semiconductor layer on the insulation layer 42, wherein the monocrystalline semiconductor layer includes for example a monocrystalline silicon layer, a monocrystalline germanium layer, a hexagonal boron nitride layer or a monocrystalline gallium arsenide layer on the insulation layer 42; a writing wire 44 which is conductive, wherein the writing wire 44 is electrically connected to the first end 43a of the Schottky diode 43; a memory unit 45, which is located on the Schottky diode 43, wherein the memory unit 45 is electrically connected to the second end 43b of the Schottky diode 43; and a selection wire 46 which is conductive, wherein the selection wire 46 is located on the memory unit 45 and is electrically connected to the memory unit 45; wherein in a case where the non-volatile memory device 40 is selected for a data to be written into, a current I0 flows through the Schottky diode 43, so as to write the data into the memory unit 45.

The present invention is advantageous over the prior art due to at least the following reasons: first, according to the present invention, the non-volatile memory device can adopt a one-way conduction type selector (i.e., Schottky diode) rather than a two-way conduction type selector as adopted by the prior art. Because the Schottky diode occupies a relatively smaller area, the present invention can save the space occupied by the selector and the device size is smaller. Second, according to the present invention, because the non-volatile memory device can adopt a one-way conduction type selector (i.e., Schottky diode), the present invention will not be limited by the electric characteristics of a two-way conduction type selector (e.g., MOS device) as adopted by the prior art. As the present invention adopts for example a Schottky diode as the selector, because the conduction current of the Schottky diode is larger than the conduction current of the MOS device, the present invention can have a broader application range. Third, as compared to the prior art where a two-way conduction type selector (e.g., MOS device) is adopted, because a one-way conduction type selector (i.e., Schottky diode) adopted by the non-volatile memory device of the present invention is directly electrically connected to the writing wire 44, the leakage current is significantly reduced. Moreover, in one embodiment, the writing wire 44 of the present invention can be formed on the insulation layer, which can provide good electric insulation from other conductive regions and thus has a better insulation effect than the prior arts to further reduce the leakage current. Under such implementation, for example, in one embodiment, the writing wire 44 of the non-volatile memory device 40 of this embodiment can be formed on the insulation layer 42. Fourth, the forward conduction voltage of a Schottky diode (in the present invention, the Schottky diode operates in forward-biased condition) is lower than that of a PN diode (about 0.3V lower), while the conduction current of the Schottky diode is relatively higher. In addition, in general, the data writing current of a non-volatile memory device is relatively higher than that of a volatile memory device. Moreover, the voltage drop (approximately 0.37V) of the Schottky diode when forward-biased is lower than that of the PN diode (at the same on-saturation current as the PN diode). Therefore as a whole, the non-volatile memory device using a Schottky diode can further reduce the operation voltage as compared to the non-volatile memory device using a PN diode to write data in the memory unit. And, compared with a non-volatile memory device using a MOS device as the selector, the present invention reduces the operation voltage even more. Furthermore, when the present invention is applied to an application including plural Schottky diodes (the details of which will be more thoroughly explained later), the present invention can be used to replace the bi-directional channel or multi-directional control (e.g., in an SOT-MRAM device), to ensure the currents flowing through the bi-directional channel to be substantially equal to each other. Fifth, the response time of a Schottky diode is relatively short, about 100 picoseconds (ps), suitable for fast operation applications.

With regard to the fourth point of the aforementioned advantages of the present invention, the details of the reduction of the operation voltage by using a Schottky diode as the selector of a non-volatile memory device are explained below: First, the current formula for a PN diode is as follows:

$$J_d = J_{ds}(e^{Vd/nVt})$$

wherein Jd is a current flowing through the PN diode;
wherein Jds is a saturation current of the PN diode, about $10^{-11} \sim 10^{-12}$ A;
wherein Vd is a voltage drop across the PN diode in conduction mode, about 0.7V;

wherein Vt is a thermal voltage, about 26 mV in room temperature;

wherein n is an ideal factor, about 1~2 for silicon.

On the other hand, the current formula for a Schottky diode is as follows:

$$J_s = J_{ss}(e^{Vd/nVt})$$

wherein Js is a current flowing through the Schottky diode;

wherein Jss is a saturation current of the PN Schottky diode, about $10^{-5}$ A;

wherein Vd is a voltage drop across the Schottky diode in conduction mode, about 0.3V;

wherein Vt is a thermal voltage, about 26 mV in room temperature;

wherein n is an ideal factor, about 1~2 for silicon.

According to the aforementioned formulas, in the conduction mode, the voltage drop across the Schottky diode is about 0.4V lower than that of the PN diode. When Jd=Js, because the saturation current Jss is about $10^6$~$10^7$ times of that of the saturation current Jds, using the number of $10^6$, the operation voltage of the Schottky diode can be lower than that of the PN diode by 0.06*6=0.36V. Therefore, compared with the PN diode, when using the Schottky diode as the selector in a non-volatile memory device, the operation voltage can be reduced by 0.3V+0.36V=0.66V.

Figure 5A:
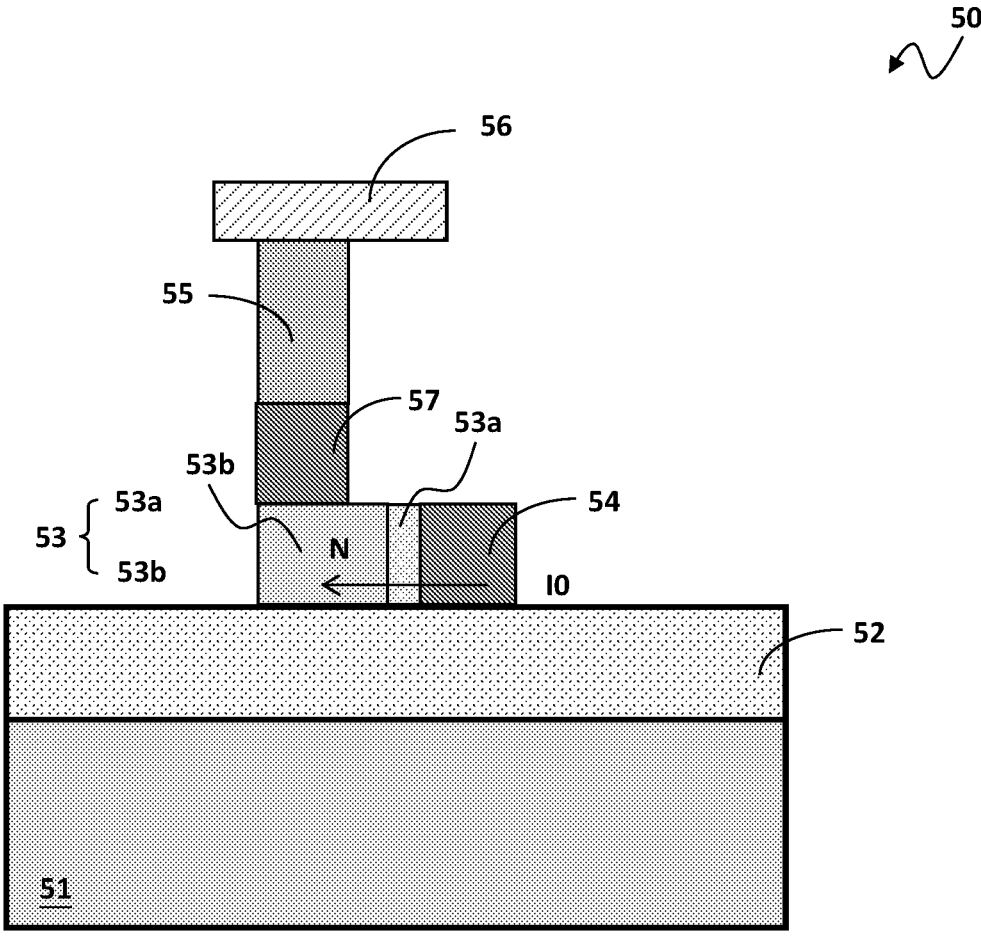
FIG. 5A and FIG. 5B respectively show a cross-sectional diagram and a three-dimensional diagram of a non-volatile memory device according to an embodiment of the present invention.
Figure 5B:

Please refer to FIG. 5A and FIG. 5B, which respectively show a cross-sectional diagram and a three-dimensional diagram of a non-volatile memory device according to an embodiment of the present invention. A non-volatile memory device 50 according to the present invention is formed on a semiconductor substrate 51. The non-volatile memory device 50 includes: an insulation layer 52, a Schottky diode 53, a writing wire 54, a memory unit 55, a selection wire 56 and a connection conduction unit 57. The insulation layer 52 is formed on the semiconductor substrate 51, wherein the insulation layer 52 is electrically insulative. The Schottky diode 53 has a first end 53a as an anode and a second end 53b as a cathode, wherein the second end 53b is formed in a monocrystalline semiconductor layer on the insulation layer 52, wherein the monocrystalline semiconductor layer includes for example a monocrystalline silicon layer a monocrystalline silicon layer, a monocrystalline germanium layer, a hexagonal boron nitride layer or a monocrystalline gallium arsenide layer on the insulation layer 52. The second end 53b of the Schottky diode 53 can be formed by, for example but not limited to, an ion implantation process step which implants N-conductivity type impurities (or P-conductivity type impurities, but N-conductivity type impurities are preferred) in a region which defines the second end 53b of the Schottky diode 53 in the form of accelerated ions. The first end 53a (a metal end) and the second end 53b form a Schottky contact, so as to form the Schottky diode 53. The writing wire 54 is conductive and the writing wire 54 is electrically connected to the first end 53a (i.e., the metal end in this embodiment) of the Schottky diode 53. The memory unit 55 is located above the Schottky diode 53. The memory unit 55 is electrically connected to the second end 53b (i.e., N-conductivity type semiconductor end in this embodiment) of the Schottky diode 53. The selection wire 56 is conductive, wherein the selection wire 56 is located on the memory unit 55 and is electrically connected to the memory unit 55. In a case where the non-volatile memory device 50 is selected for a data to be written into, a first current I0 flows through the Schottky diode 53, so as to write the data into the memory unit 55.

This embodiment of FIG. 5A and FIG. 5B is different from the embodiment of FIG. 4A and FIG. 4B in that: in this embodiment, the non-volatile memory device 50 further incudes the connection conduction unit 57, which is conductive. The connection conduction unit 57 is configured to electrically connect the memory unit 55 to the second end 53b (i.e., N-conductivity type semiconductor end in this embodiment) of the Schottky diode 53. In this embodiment, as shown in FIG. 5A and FIG. 5B, the connection conduction unit 57 can be, for example but not limited to, stacked and connected on the second end 53b of the Schottky diode 53. And, the memory unit 55 is stacked and connected on the connection conduction unit 57.

Figure 6A:
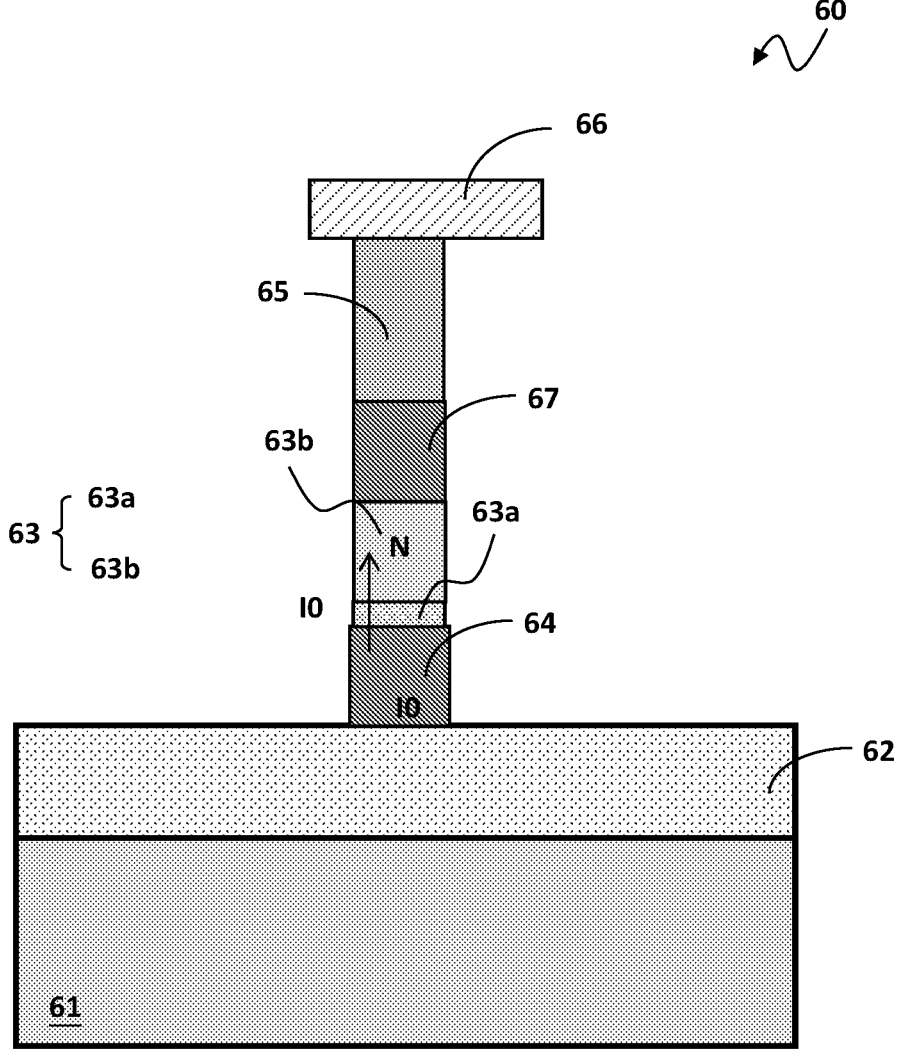
FIG. 6A shows a cross-sectional diagram of a non-volatile memory device according to an embodiment of the present invention.

Please refer to FIG. 6A, which shows a cross-sectional diagram of a non-volatile memory device according to an embodiment of the present invention. A non-volatile memory device 60 according to the present invention is formed on a semiconductor substrate 61. The non-volatile memory device 60 includes: an insulation layer 62, a Schottky diode 63, a writing wire 64, a memory unit 65, a selection wire 66, and a connection conduction unit 67. The insulation layer 62 is formed on the semiconductor substrate 61, wherein the insulation layer 62 is electrically insulative. The Schottky diode 63 has a first end 63a as an anode and a second end 63b as a cathode, wherein the second end 63b is formed in a monocrystalline semiconductor layer on the insulation layer 62, wherein the monocrystalline semiconductor layer includes for example a monocrystalline silicon layer, a monocrystalline germanium layer, a hexagonal boron nitride layer or a monocrystalline gallium arsenide layer on the insulation layer 62. The second end 63b of the Schottky diode 63 can be formed by, for example but not limited to, an ion implantation process step which implants N-conductivity type impurities (or P-conductivity type but N-impurities, conductivity type impurities are preferred) in a region which defines the second end 63b of the Schottky diode 63 in the form of accelerated ions. The first end 63a (a metal end) and the second end 63b form a Schottky contact, so as to form the Schottky diode 63. The writing wire 64 is conductive and the writing wire 64 is electrically connected to the anode end 63a (i.e., metal end in this embodiment) of the Schottky diode 63. The memory unit 65 is located on the Schottky diode 63. The memory unit 65 is electrically connected to the second end 63b (i.e., N-conductivity type semiconductor end in this embodiment) of the Schottky diode 63. The selection wire 66 is conductive, wherein the selection wire 66 is located on the memory unit 65 and is electrically connected to the memory unit 65. In a case where the non-volatile memory device 60 is selected for a data to be written into, a first current I0 flows through the Schottky diode 63, so as to write the data into the memory unit 65.

This embodiment of FIG. 6A is different from the embodiment of FIG. 4A and FIG. 4B in that: in this embodiment, the non-volatile memory device 60 further incudes the connection conduction unit 67, which is conductive. The connection conduction unit 67 is configured to electrically connect the memory unit 65 to the second end 63b (i.e., N-conductivity type semiconductor end in this embodiment) of the Schottky diode 63, wherein the connection conduction unit 67 and the second end 63b of the Schottky diode 63 form an ohmic contact; ohmic contact is well known by those skilled in the art, so details thereof are omitted here. In this embodiment, as shown in FIG. 6A, the connection conduction unit 67 is for example a metal wire or a metal plug. Metal wire or metal plug is well known in the field of semiconductor manufacture technology by those skilled in the art, so details thereof are omitted here. The writing wire 64 can be, for example but not limited to, stacked and connected on the insulation layer 62. And, the Schottky diode 63 is stacked and connected on the writing wire 64. For how to form a monocrystalline silicon layer on a metal layer, please refer to US 2010/0044670A1.

Figure 6B:
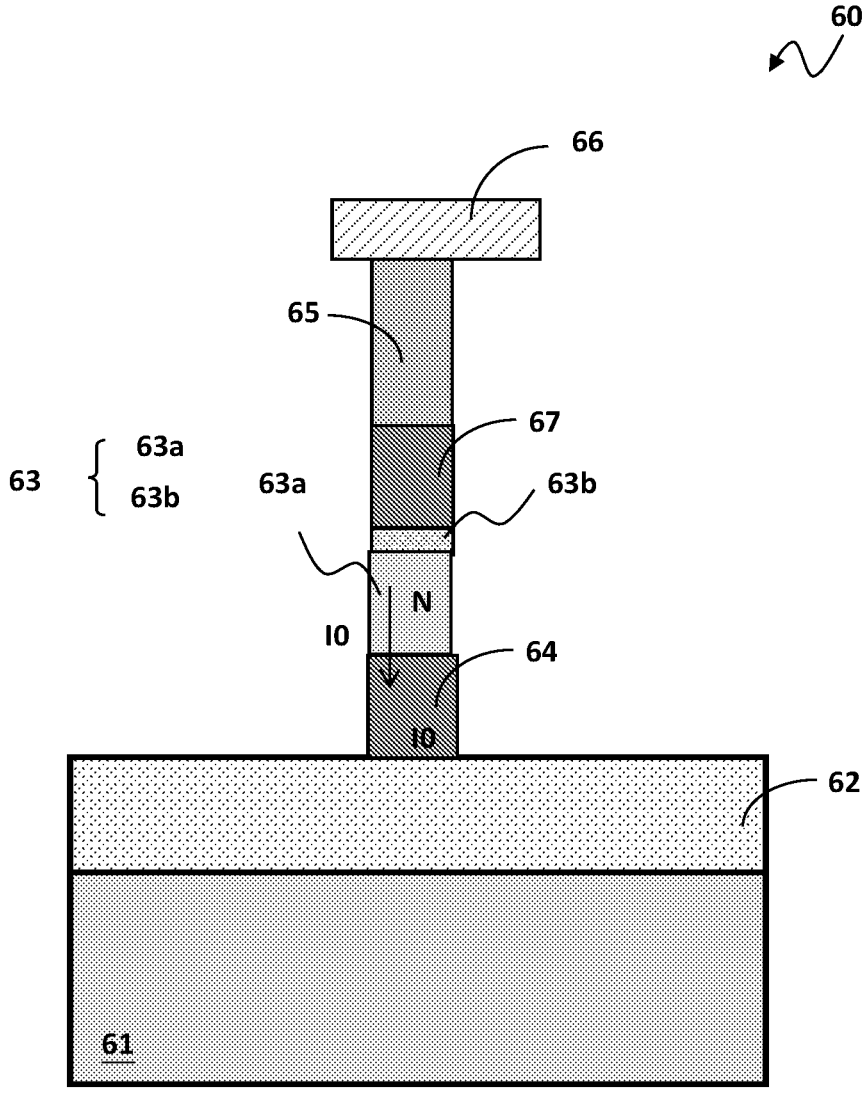
FIG. 6B shows a cross-sectional diagram of a non-volatile memory device according to an embodiment of the present invention.

Please refer to FIG. 6B, which shows a cross-sectional diagram of a non-volatile memory device according to an embodiment of the present invention. This embodiment is different from the embodiment shown in FIG. 6A in that, in this embodiment, the first end 63*a* of the Schottky diode 63 is an N-conductivity type semiconductor end, and the second end 63*b* of the Schottky diode 63 is a metal end, wherein the second end 63*b* of the Schottky diode 63 is on the first end 63*a* (the N-conductivity type semiconductor end) of the Schottky diode 63. The second end 63*b* of the Schottky diode 63 is electrically connected to the connection conduction unit 67. In normal operation, the first current I0 flows downward into the first end 63*a* of the Schottky diode 63 (the N-conductivity type semiconductor end), and then enters the writing wire 64.

Figure 7A:
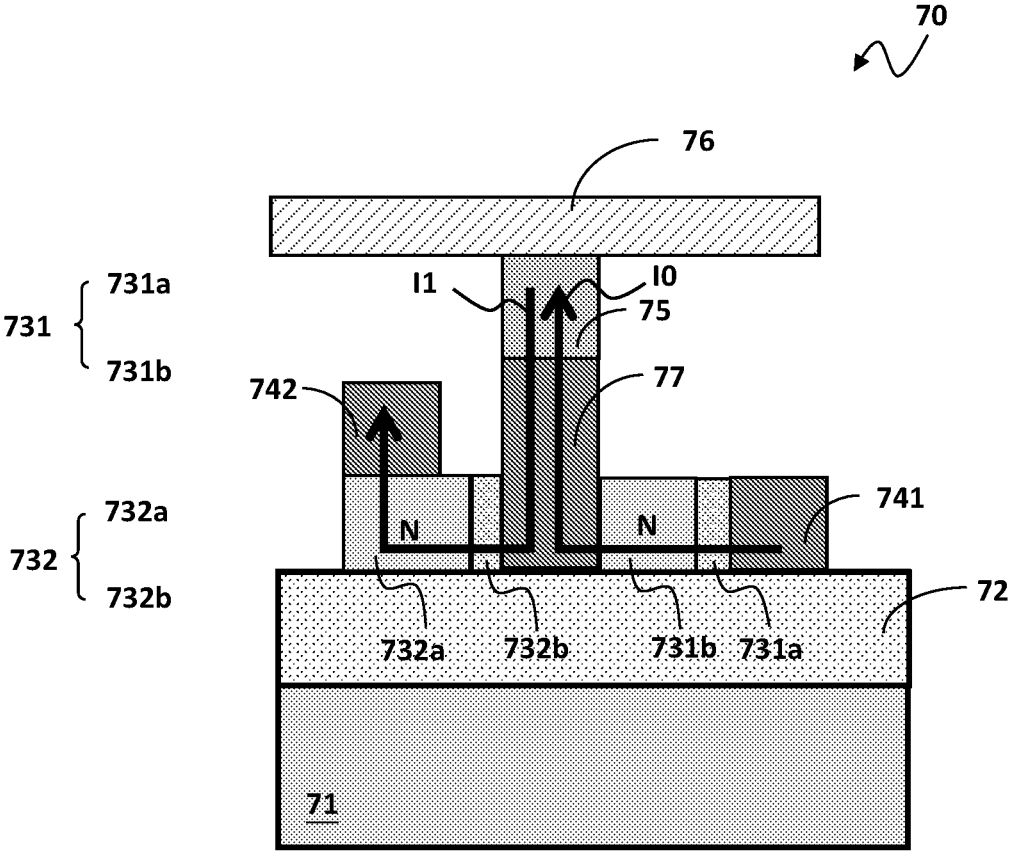
FIG. 7A and FIG. 7B respectively show a cross-sectional diagram and a three-dimensional diagram of a non-volatile memory device according to an embodiment of the present invention.
Figure 7B:
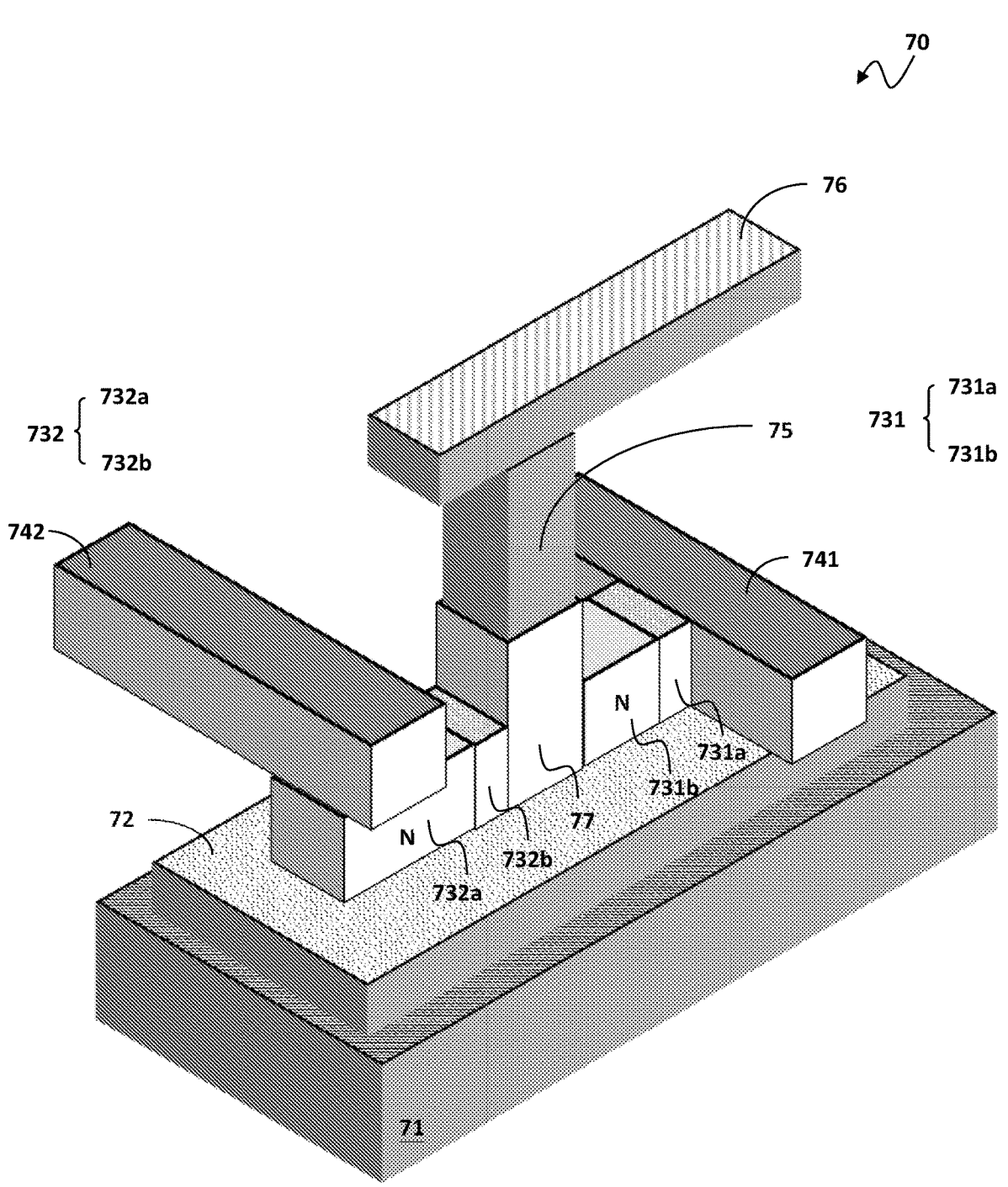

Please refer to FIG. 7A and FIG. 7B, which respectively show a cross-sectional diagram and a three-dimensional diagram of a non-volatile memory device according to an embodiment of the present invention. A non-volatile memory device 70 according to the present invention is formed on a semiconductor substrate 71. In this embodiment, the non-volatile memory device 70 includes: an insulation layer 72, writing wires 741 and 742, Schottky diodes 731 and 732, a memory unit 75, a selection wire 76 and a connection conduction unit 77. The insulation layer 72 is formed on the semiconductor substrate 71, wherein the insulation layer 72 is electrically insulative. The Schottky diode 731 has a first end 731*a* as an anode and a second end 731*b* as a cathode, wherein the second end 731*b* is formed in a monocrystalline semiconductor layer on the insulation layer 72, wherein the monocrystalline semiconductor layer includes for example a monocrystalline silicon layer, a monocrystalline germanium layer, a hexagonal boron nitride layer or a monocrystalline gallium arsenide layer on the insulation layer 72. The second end 731*b* of the Schottky diode 731 can be formed by, for example but not limited to, an ion implantation process step which implants N-conductivity type impurities (or P-conductivity type impurities, but N-conductivity type impurities are preferred) in a region which defines the second end 731*b* of the Schottky diode 731 in the form of accelerated ions. The first end 731*a* (a metal end) and the second end 731*b* form a Schottky contact, so as to form the Schottky diode 731. In this embodiment, the Schottky diode 731 is stacked and connected on the insulation layer 72. And, the first end 731*a* and the second end 731*b* of the Schottky diode 731 can be, for example but not limited to, adjacently connected to each other (i.e. in contact with each other) along a horizontal direction. The non-volatile memory device 70 of this embodiment further includes the Schottky diode 732. The Schottky diode 732 has a first end 732*a* as a cathode and a second end 732*b* as an anode, wherein the first end 732*a* is formed in a monocrystalline semiconductor layer on the insulation layer 72, wherein the monocrystalline semiconductor layer includes for example the monocrystalline silicon layer, the monocrystalline germanium layer, a hexagonal boron nitride layer or the monocrystalline gallium arsenide layer on the insulation layer 72. The first end 732*a* of the Schottky diode 732 can be formed by, for example but not limited to, an ion implantation process step which implants N-conductivity type impurities (or P-conductivity type impurities, but N-conductivity type impurities are preferred) in a region which defines the first end 732*a* of the Schottky diode 732 in the form of accelerated ions. The first end 732*a* and the second end 732*b* (a metal end) form a Schottky contact, so as to form the Schottky diode 732. In this embodiment, the Schottky diode 732 is stacked and connected on the insulation layer 72. And, the first end 732*a* and the second end 732*b* of the Schottky diode 732 can be, for example but not limited to, adjacently connected to each other (i.e. in contact with each other) along a horizontal direction.

The writing wire 741 is conductive and the writing wire 741 is electrically connected to the first end 731*a* (i.e., the metal end in this embodiment) of the Schottky diode 731. In this embodiment, the writing wire 741 can be, for example but not limited to, connected and connected to the first end 731*a* along a horizontal direction. The writing wire 742 is conductive and the writing wire 742 is electrically connected to the first end 732*a* (i.e., N-conductivity type semiconductor end in this embodiment) of the Schottky diode 732. In this embodiment, the writing wire 742 can be, for example but not limited to, stacked and connected on the first end 732*a*. The memory unit 75 is located above the Schottky diodes 731 and 732. The memory unit 75 is electrically connected to the second end 731*b* (i.e., N-conductivity type semiconductor end in this embodiment) of the Schottky diode 731 and the second end 732*b* (i.e., metal end in this embodiment) of the Schottky diode 732 by the connection conduction unit 77. In this embodiment, the connection conduction unit 77 lies between the second end 731*b* and the second end 732*b*. In this embodiment, the selection wire 76 is located on the memory unit 75 and is electrically connected to the memory unit 75. In a case where the non-volatile memory device 70 is selected for a data to be written into, a first current I0 flows through the Schottky diode 731, so as to write the data into the memory unit 65. In a case where the non-volatile memory device 70 for another data to be written into, a second current I1 flows through the Schottky diode 732, so as to write the other data into the memory unit 75. It is noteworthy that, in this embodiment, the flowing direction of the first current I0 through the memory unit 75 is opposite to the flowing direction of the second current I1 through the memory unit 75.

In one embodiment, the second end 731*b* of the Schottky diode 731 and the first end 732*a* of the Schottky diode 732 are formed in the monocrystalline silicon layer, the monocrystalline germanium layer, the hexagonal boron nitride layer or the monocrystalline gallium arsenide layer on the insulation layer 72. As shown in FIG. 7A, in one preferred embodiment, the Schottky diodes 731 and 732 are both two-end devices (e.g., not diode-connected MOS devices). It is noteworthy that, according to the present invention, the directions of the Schottky contacts of the Schottky diodes 731 and 732 can be modified; the directions of the Schottky contacts of the Schottky diodes 731 and 732 are not limited to the implementation as shown, wherein the N-conductivity type regions are at left sides and the metal ends are at right sides of the Schottky diodes 731 and 732 shown in FIG. 7A. It should be understood that such implementation in the above-mentioned preferred embodiment of FIG. 7A is only an illustrative example, but not for limiting the broadest scope of the present invention. In other embodiments, it is also practicable and within the scope of the present invention that the metal end is at an upper position while the N-conductivity type region is at a lower position, or the metal end is a lower position while the N-conductivity type region is an upper position (i.e., the metal end and N-conductivity type region can be arranged to be in contact with each other along a vertical direction rather than along a horizontal direction). In one embodiment, the writing wires 741 and 742 are made of metal. Such metal wire can include, for example but not limited to, metal materials made of aluminum (Al), copper (Cu) or AlCu alloy. In one embodiment, the selection wires and the writing wires of the present invention can be both made of metal.

According to the present invention, in one embodiment, as shown in this embodiment, the non-volatile memory device is formed on a semiconductor-on-insulator (SOI) substrate or a semiconductor-metal-on-insulator (SMOI) substrate. SOI substrate and SMOI substrate are well known to those skilled in the art, so the details thereof are not redundantly explained here.

It is noteworthy that, as the non-volatile memory device 70 is adopted in different applications, the first current I0 can accordingly have different corresponding current flow paths. For example, referring to FIG. 7A, in a case where the non-volatile memory device 70 is a PCRAM device, the memory unit 75 is correspondingly a phase change area. Under such circumstance, as shown in FIG. 7A, the first current I0 flows along a current flow path in which the first current I0 flows from the Schottky diode 731, through the connection conduction unit 77 to the memory unit 75, to change crystallization status of the material in the memory unit 75. Under such circumstance, the selection wire 76 for example can be electrically connected to a ground level. For another example, in a case where the non-volatile memory device 70 is a spin transfer torque (STT) type MRAM device, the memory unit 75 is correspondingly a magnetic area. Under such circumstance, the first current I0 flows along a current flow path in which the first current I0 flows from the Schottky diode 731 through the connection conduction unit 77 without flowing through the memory unit 75, to change a magnetization orientation of the electrode in the memory unit 75 so as to change the resistance of the memory unit 75, whereby data can be written into the memory unit 75.

Figures 8A, 8C:
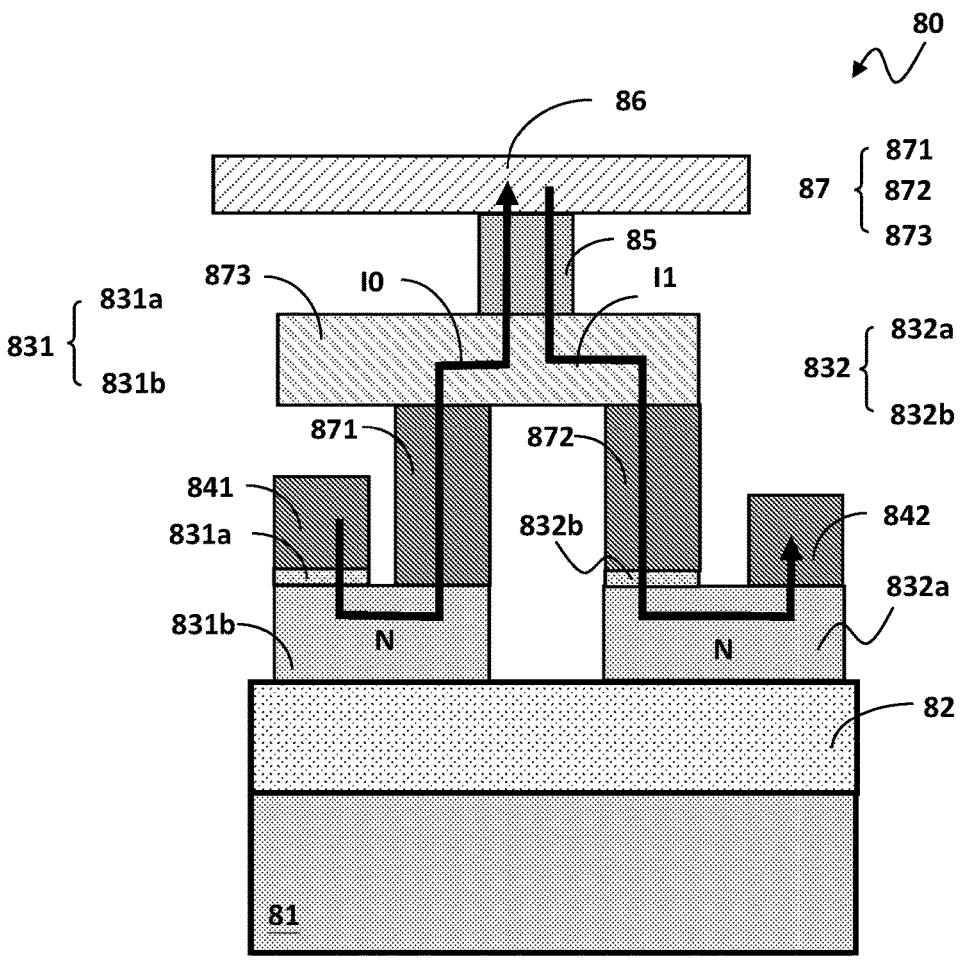
Figure 8B:
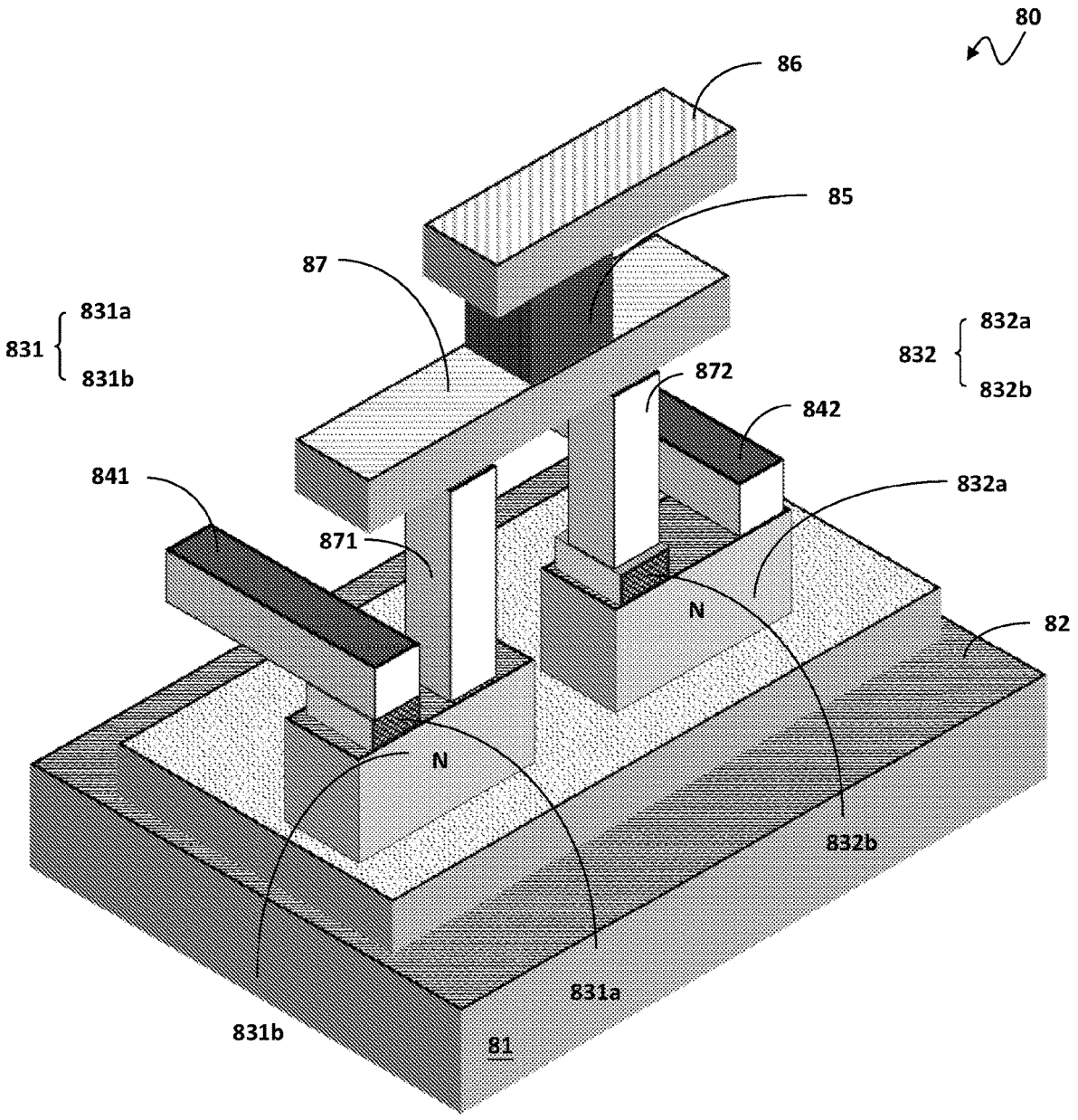

Please refer to FIG. 8A, FIG. 8B and FIG. 8C. FIG. 8A and FIG. 8B respectively show a cross-sectional diagram and a three-dimensional diagram of a non-volatile memory device according to an embodiment of the present invention, while, FIG. 8C shows an operation table corresponding to an operation of FIG. 8A and FIG. 8B. As shown in FIG. 8A and FIG. 8B, a non-volatile memory device 80 according to the present invention is a three-end device and is formed on a semiconductor substrate 81. The non-volatile memory device 80 includes: an insulation layer 82, writing wires 841 and 842, Schottky diodes 831 and 832, a memory unit 85, a selection wire 86 and a connection conduction unit 87. The three ends of the non-volatile memory device 80 are: the writing wire 841, the writing wire 842 and the selection wire 86, respectively. The connection conduction unit 87 includes a first portion 871, a second portion 872, and a third portion 873. The Schottky diode 831 includes a first end 831a and a second end 831b. The Schottky diode 832 includes a first end 832a and a second end 832b.

The insulation layer 82 is formed on the semiconductor substrate 81, wherein the insulation layer 82 is electrically insulative. The Schottky diode 831 has a first end 831a as an anode and a second end 831b as a cathode. The Schottky diode 832 has a first end 832a as a cathode and a second end 832b as an anode. The second end 831b and the first end 832a are formed in a monocrystalline semiconductor layer on the insulation layer 52, wherein the monocrystalline semiconductor layer includes for example a monocrystalline silicon layer, a monocrystalline germanium layer, a hexagonal boron nitride layer or a monocrystalline gallium arsenide layer on the insulation layer 82. The writing wire 841 and the writing wire 842 are conductive. The writing wire 841 is electrically connected to the first end 831a (i.e., a metal end in this embodiment) of the Schottky diode 831, whereas, the writing wire 842 is electrically connected to the first end 832a (i.e., N-conductivity type semiconductor end in this embodiment) of the Schottky diode 832. The memory unit 85 is located above the Schottky diodes 831 and 832. The memory unit 85 is electrically connected to the second end 831b (i.e., N-conductivity type semiconductor end in this embodiment) of the Schottky diode 831 and the second end 832b (i.e., a metal end in this embodiment) of the Schottky diode 832 by the connection conduction unit 87. The connection conduction unit 87 includes the first portion 871, the second portion 872, and the third portion 873. The selection wire 86 is located on the memory unit 85 and is electrically connected to the memory unit 85. In a case where the non-volatile memory device 80 is selected for a data to be written into, a first current I0 flows through the Schottky diode 831, so as to write the data into the memory unit 85. In a case where the non-volatile memory device 80 is selected for another data to be written into, a second current I1 flows through the Schottky diode 832, so as to write the other data into the memory unit 85. It is noteworthy that, in this embodiment, the flowing direction of the first current I0 through the memory unit 85 is opposite to the flowing direction of the second current I1 through the memory unit 85.

In one embodiment as an example, as shown by the operation table in FIG. 8C, when an addressing operation selects the non-volatile memory device 80, to write a data indicative of "0" (or "1" depending on the definition of the bit) into the memory unit 85, the writing wire 841 is electrically connected to a writing voltage Vw and the selection wire 86 is electrically connected to a ground level, so as to generate the first current I0. As a result, the thus generated first current I0 flows from the writing wire 841, through the Schottky diode 831 (wherein the N-conductivity type region is at a lower position whereas the metal end is at an upper position), the connection conduction unit 87 (the first portion 871 and the third portion 873) and the memory unit 85, to the selection wire 86. By this current, the non-volatile memory device 80 can write a data indicative of "0" into the memory unit 85 through changing a crystallization status of a material of a phase change area, a magnetization orientation of a magnetic area or a resistance of a resistance change area in the memory unit 85. In regard to the writing wire 842, under such situation, the writing wire 842 is electrically floating. With respect to unselected non-volatile memory devices 80, the writing wires 841 and 842 and the selection wire 86 of the unselected non-volatile memory devices 80 for example can also be electrically floating.

On the other hand, for another example, as shown by the operation table in FIG. 8C, when an addressing operation selects the non-volatile memory device 80, to write a data indicative of "1" (or "0" depending on the definition of the bit) into the memory unit 85, the selection wire 86 is electrically connected to the writing voltage Vw and the writing wire 842 is electrically connected to the ground level, so as to generate the second current I1. As a result, the thus generated second current I1 flows from the selection wire 86, through the memory unit 85, the connection conduction unit 87 (the third portion 873 and the second portion 872) and the Schottky diode 832 (wherein the N-conductivity type region is at a lower position whereas the metal end is at an upper position), to the writing wire 842. By this current, the non-volatile memory device 80 can write a data indicative of "1" into the memory unit 85 through changing a crystallization status of a material of a phase change area, a magnetization orientation of a magnetic area or a resistance of a resistance change area in the memory unit 85. In regard to the writing wire 841, under such situation, the writing wire 841 is electrically floating. With respect to unselected non-volatile memory devices 80, the writing wires 841 and 842 and the selection wire 86 of the unselected non-volatile memory devices 80 for example can also be electrically floating. The writing voltage Vw for example can be a positive voltage and is at least higher than a forward conduction voltage of a Schottky diode, so that a current can flow from an end electrically connected to the writing voltage Vw to another end electrically connected to the ground level.

In one embodiment, the non-volatile memory device 80 can read data stored in the memory unit 85 by, for example, electrically connecting the selection wire 86 to a reading voltage Vr, and determining that the data stored in the memory unit 85 is "0" or "1" according to a voltage of the writing wire 842.

Figure 8D:
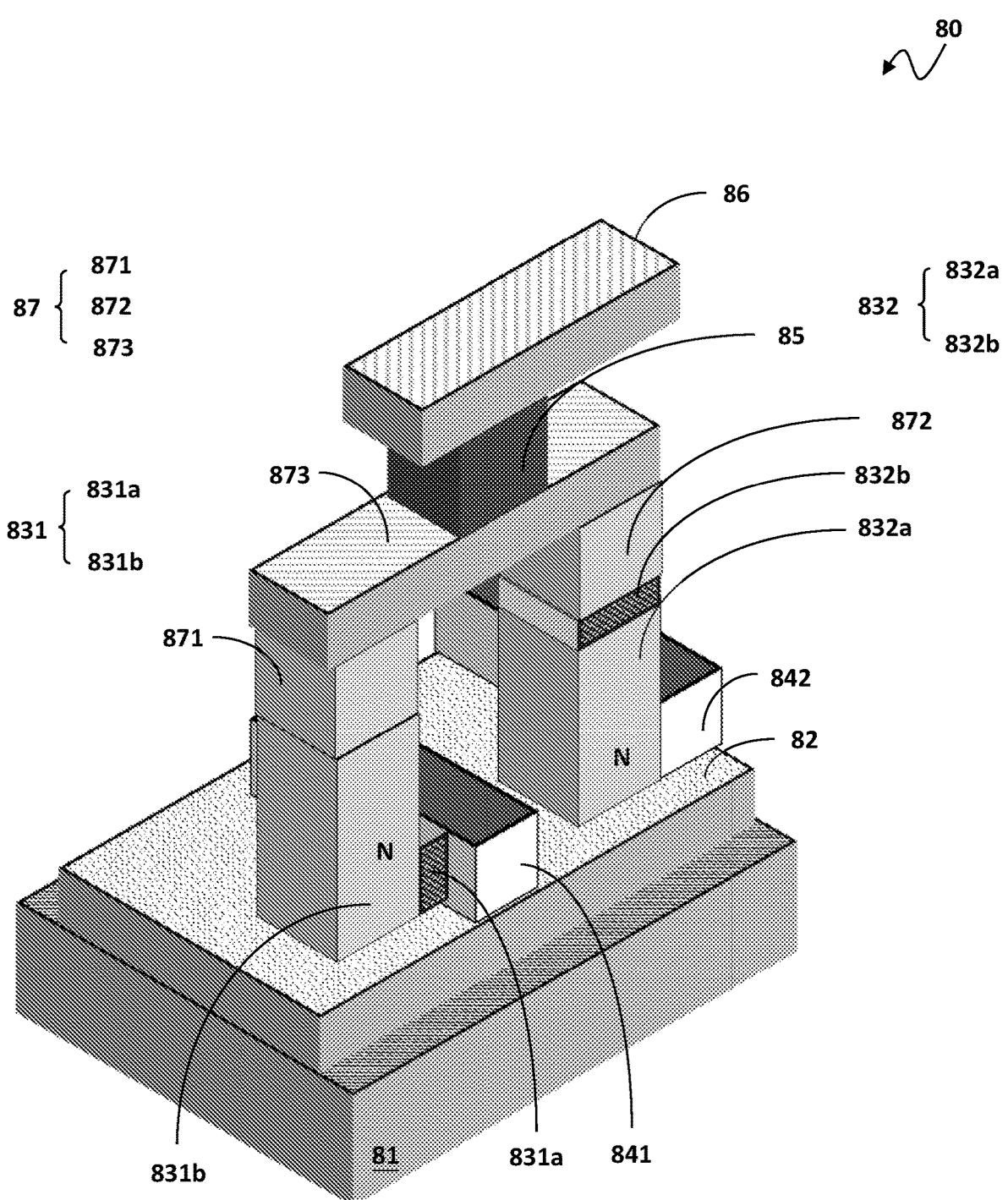
FIG. 8D shows a three-dimensional diagram of a non-volatile memory device according to an embodiment of the present invention.

Please refer to FIG. 8D, which shows a three-dimensional diagram of a non-volatile memory device according to an embodiment of the present invention. This embodiment of FIG. 8D is different from the embodiment of FIG. 8A and FIG. 8B, in that: in this embodiment, the connection conduction unit 87 includes: a first portion 871, a second portion 872 and a third portion 873. The first portion 871 is stacked and connected on the second end 831*b* (i.e., N-conductivity type semiconductor end in this embodiment) of a Schottky diode 831. The second portion 872 is stacked and connected on a second end 832*b* (i.e., metal end in this embodiment) of the Schottky diode 832. The third portion 873 is stacked and connected on the first portion 871 and the second portion 872, so as to electrically connect the Schottky diode 831 and the Schottky diode 832 to the memory unit 85. Additionally, unlike the embodiment wherein the first end 831*a* and the second end 831*b* of the Schottky diode 831 is connected to each other along a vertical direction (as shown in FIG. 8A and FIG. 8B), in this embodiment, the first end 831*a* and the second end 831*b* of the Schottky diode 831 are connected to each other along a horizontal direction and the writing wire 842 and the first end 832*a* of the Schottky diode 832 are connected to each other along a horizontal direction.

Figures 9A, 9B:
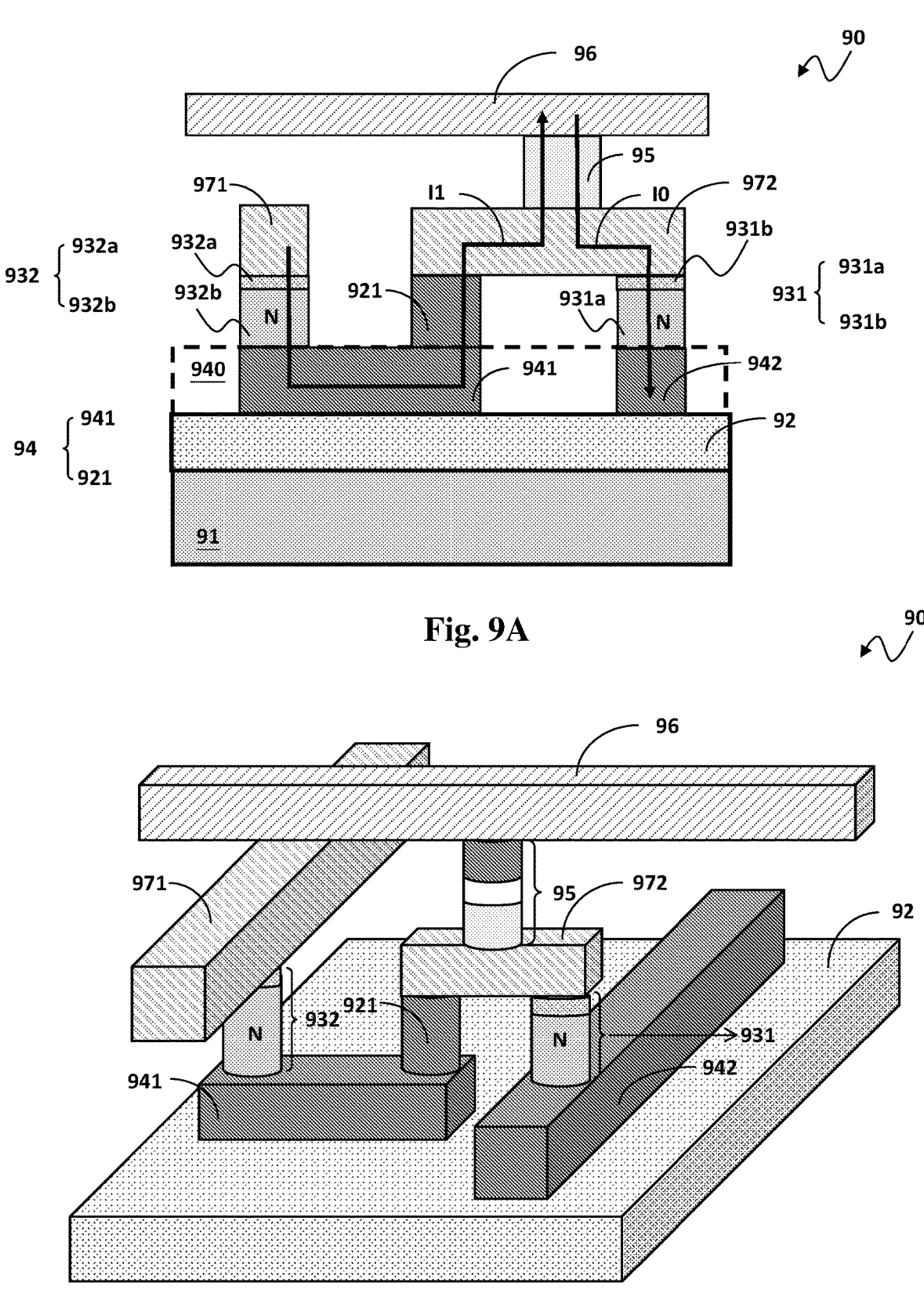

Please refer to FIG. 9A, FIG. 9B and FIG. 9C. FIG. 9A and FIG. 9B respectively show a cross-sectional diagram and a three-dimensional diagram of a non-volatile memory device according to an embodiment of the present invention, while, FIG. 9C shows an operation table corresponding to an operation of FIG. 9A and FIG. 9B. As shown in FIG. 9A and FIG. 9B, a non-volatile memory device 90 according to the present invention is formed on a semiconductor substrate 91. The non-volatile memory device 90 includes: an insulation layer 92, writing wires 942 and 971, Schottky diodes 931 and 932, a memory unit 95, a selection wire 96 and connection conduction units 94 and 972. This embodiment can be applied in, for example but not limited to, a STT-MRAM device or a bi-directional RRAM device.

The insulation layer 92 is formed on the semiconductor substrate 91, wherein the insulation layer 92 is electrically insulative. The writing wire 942 and the writing wire 971 are conductive. The writing wire 942 is electrically connected to the first end 931*a* (i.e., N-conductivity type end in this embodiment) of the Schottky diode 931, whereas, the writing wire 971 is electrically connected to the first end 932*a*

(i.e., metal end in this embodiment) of the Schottky diode 932. The Schottky diode 931 has the first end 931*a* as a cathode and a second end 931*b* as an anode, and the Schottky diode 932 has the first end 932*a* as an anode and a second end 932*b* as a cathode. The first end 931*a* and the second end 932*b* are formed in a monocrystalline semiconductor layer on the insulation layer 52, wherein the monocrystalline semiconductor layer includes for example a monocrystalline silicon layer, a monocrystalline germanium layer, a hexagonal boron nitride layer or a monocrystalline gallium arsenide layer on a first conductive layer 940 on the insulation layer 92. The memory unit 95 is located above the Schottky diodes 931 and 932. The memory unit 95 is electrically connected to the second end 931*b* (i.e., N-conductivity type semiconductor end in this embodiment) of the Schottky diode 931 and the second end 932*b* (i.e., N-conductivity type end in this embodiment) of the Schottky diode 932. The selection wire 96 is located on the memory unit 95 and is electrically connected to the memory unit 95. In a case where the non-volatile memory device 90 is selected for a data to be written into, a first current I0 flows through the Schottky diode 931, so as to write the data into the memory unit 95. In a case where the non-volatile memory device 90 is selected for another data to be written into, a second current I1 flows through the Schottky diode 932, so as to write the other data into the memory unit 95. It is noteworthy that, in this embodiment, the flowing direction of the first current I0 through the memory unit 95 is opposite to the flowing direction of the second current I1 through the memory unit 95.

In this embodiment, the connection conduction unit 972 is configured to electrically connect the memory unit 95 to the second end 931*b* (i.e., metal end in this embodiment) of the Schottky diode 931. A portion of the connection conduction unit 972 is stacked and connected on the second end 931*b* of the Schottky diode 931. The connection conduction unit 94 is configured to electrically connect the connection conduction unit 972 to the second end 932*b* of the Schottky diode 932, so as to electrically connect the memory unit 95 to the second end 932*b*. The first writing wire 942 is stacked and connected on the insulation layer 92; the first end 931*a* is stacked and connected on the first writing wire 942; the second end 931*b* is stacked and connected on the anode end 931*a*. A first portion 941 of the connection conduction unit 94 is stacked and connected on the insulation layer 92; a second portion 921 of the connection conduction unit 94 is stacked and connected on the first portion 941; another portion of the connection conduction unit 972 is stacked and connected on the second portion 921. The second end 932*b* of the Schottky diode 932 is stacked and connected on the first portion 941; the first end 932*a* of the Schottky diode 932 is stacked and connected on the second end 932*b*; the writing wire 971 is stacked and connected on the first end 932*a*.

The writing wires 942 and a first portion 941 of the connection conduction unit 94 are formed by one same metal line formation process. The first end 931*a* and the second end 932*b* are formed by one same ion implantation process or by one same epitaxial process. The second end 931*b* and the first end 932*a* are formed by one same metal line formation process. For example, the writing wires 942 and the first portion of the connection conduction unit 941 are formed in the first conductive layer 940, which is located on and connected to the insulation layer 92.

As one of average skill in the art readily understands, "one same metal line formation process", refers to a process which first forms a metal layer by a metal deposition process, and next by one same lithography process wherein one same mask is adopted, a layout of metal lines in the metal layer is defined; and next the metal lines are formed by one same etching process. Besides, as one of average skill in the art readily understands, "one same ion implantation process", refers to an impurities doping process where a single type or plural types of impurities of a same species are implanted into a same depth of a semiconductor layer in the form of accelerated ions by a same accelerating voltage. Moreover, as one of average skill in the art readily understands, "same epitaxial process", refers to a process wherein new crystal is grown on an existing monocrystalline silicon layer, so as to create a new semiconductor layer. Such process is also named as "epitaxial growth process". The above-mentioned three processes are well known to those skilled in the art, so the details thereof are not redundantly explained here.

In one embodiment as an example, as shown by the operation table in FIG. 9C, when an addressing operation selects the non-volatile memory device 90 to write a data indicative of "0" (or "1" depending on the definition of the bit) into the memory unit 95, the writing wire 942 is electrically connected to a writing voltage Vw and the selection wire 96 is electrically connected to a ground level, so as to generate the first current I0. As a result, the thus generated first current I0 flows from the writing wire 942, through the Schottky diode 931 (where the N-conductivity type region is at a lower position whereas the metal end is at an upper position), the connection conduction unit 972 and the memory unit 95, to the selection wire 96. By this current, the non-volatile memory device 90 can write a data indicative of "0" into the memory unit 95 through changing a crystallization status of a material of a phase change area, a magnetization orientation of a magnetic area or a resistance of a resistance change area in the memory unit 95. In regard to the writing wire 971, under such situation, the writing wire 971 is electrically floating. With respect to unselected non-volatile memory devices 90, the writing wires 942 and 971 and the selection wire 96 of the unselected non-volatile memory devices 90 for example can also be electrically floating.

On the other hand, for another example, as shown by the operation table in FIG. 9C, when an addressing operation selects the non-volatile memory device 90 to write a data indicative of "1" (or "0" depending on the definition of the bit) into the memory unit 95, the selection wire 96 is electrically connected to the writing voltage Vw and the writing wire 971 is electrically connected to the ground level, so as to generate the second current I1. As a result, the thus generated second current I1 flows from the selection wire 96, through the memory unit 95, a second portion 921 and a first portion 941 of the connection conduction unit 94, the Schottky diode 932 (where the N-conductivity type region is at a lower position whereas the metal end is at an upper position), to the writing wire 971. By this current, the non-volatile memory device 90 can write a data indicative of "1" into the memory unit 95 through changing a crystallization status of a material of a phase change area, a magnetization orientation of a magnetic area or a resistance of a resistance change area in the memory unit 95. In regard to the writing wire 942, under such situation, the writing wire 942 is electrically floating. With respect to unselected non-volatile memory devices 90, the writing wires 942 and 971 and the selection wire 96 of the unselected non-volatile memory devices 90 for example can also be electrically floating.

In one embodiment, the non-volatile memory device 90 can read data stored in the memory unit 95 by electrically connecting the selection wire 96 to a reading voltage Vr, and determining that the data stored in the memory unit 95 is "0" or "1" according to a voltage of the writing wire 971.

With regard to the details as to how a monocrystalline silicon layer is formed on a metal layer, please refer to US Patent Publication No. 2010/0044670A1. However, this prior art describes that it can be applied in a PCRAM device and an MRAM device, which is incorrect. An MRAM device requires two currents of different current flow directions, so this prior art having one single Schottky diode cannot achieve an MRAM device.

Figure 9D:
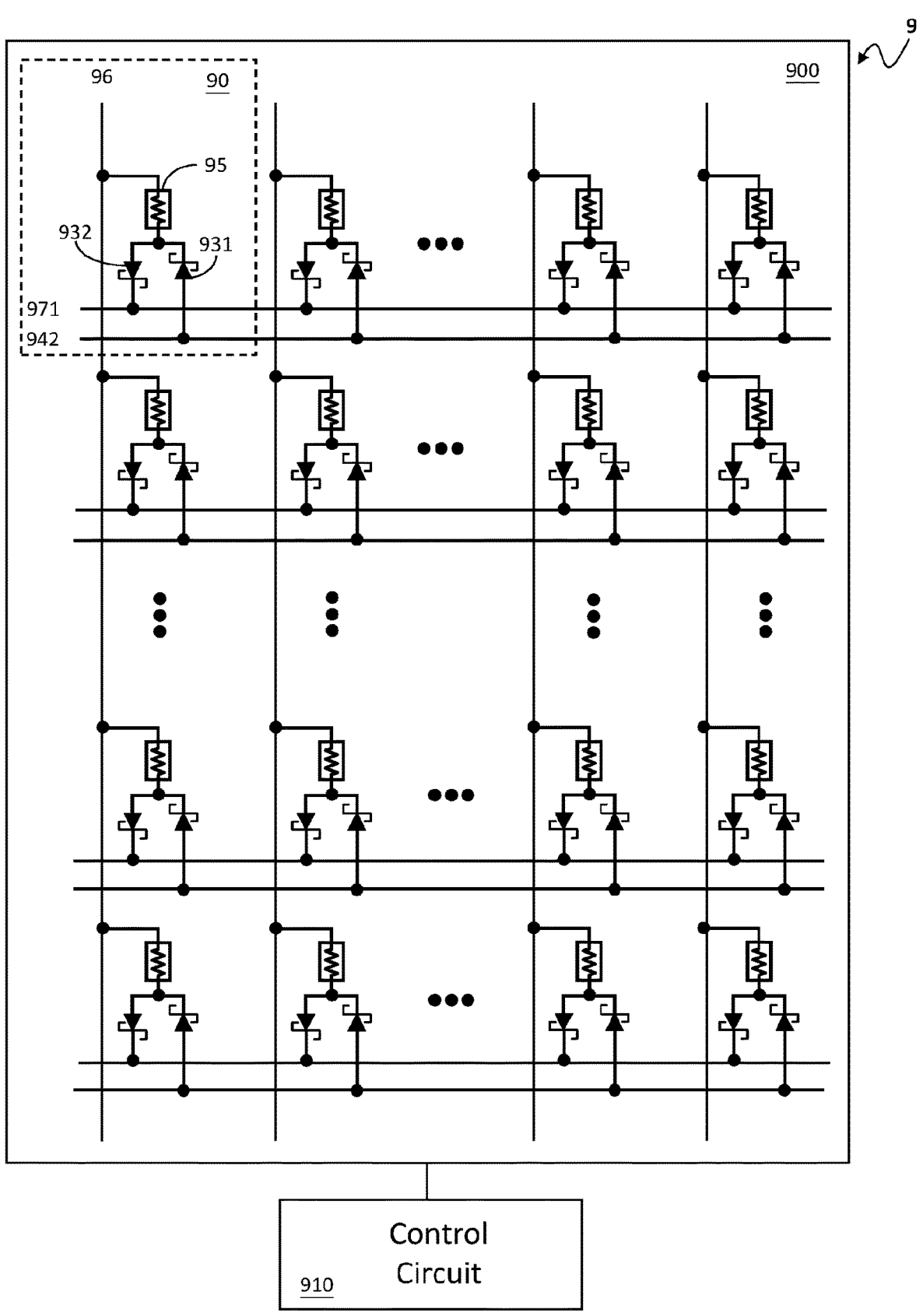
FIG. 9D shows a schematic diagram of a non-volatile memory circuit according to an embodiment of the present invention.

FIG. 9D shows a schematic diagram of a non-volatile memory circuit according to an embodiment of the present invention. As shown in FIG. 9D and also referring to FIGS. 9A-9B, the non-volatile memory circuit 9 includes: a non-volatile memory device array 900 including plural non-volatile memory devices 90; and a control circuit 910 controlling the non-volatile memory device array 900 so as to read from or write into the non-volatile memory devices 90; wherein the non-volatile memory device 90, as shown by Fig. FIGS. 9A-9B, includes: an insulation layer 92, which is electrically insulative; Schottky diodes 931 and 932, on the insulation layer 92; writing wires 942 and 971 which are conductive, wherein the writing wires 942 and 971 are respectively electrically connected to an anode end 931a of the Schottky diode 931, and a first end 932a of the Schottky diode 932; a memory unit 95, which is located on the Schottky diodes 931 and 932, wherein the memory unit 95 is electrically connected to a second end 931b of the Schottky diode 931 and a second end 932b of the Schottky diode 932; and a selection wire 96 which is conductive, wherein the selection wire 96 is located on the memory unit 95 and is electrically connected to the memory unit 95; wherein in a case where the non-volatile memory device 90 is selected for a data to be written into, a first current I0 flows through the Schottky diode 931, so as to write the data into the memory unit 95, and in a case where the non-volatile memory device 90 is selected for another data to be written into, a second current I1 flows through the Schottky diode 932, so as to write the other data into the memory unit 95. The flowing direction of the first current I0 is opposite to the flowing direction of the second current I1.

Figure 10A:
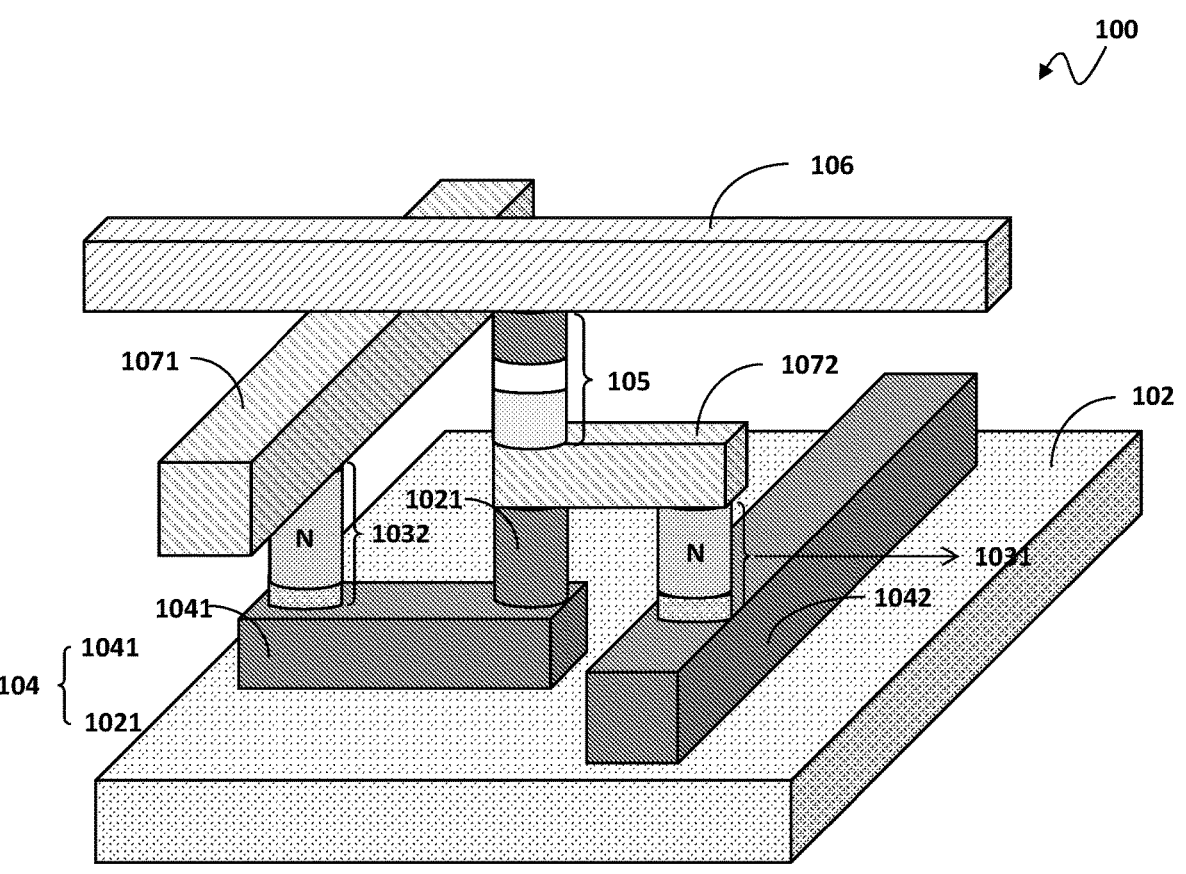
FIG. 10A shows a three-dimensional diagram of a non-volatile memory device according to an embodiment of the present invention.

Please refer to FIG. 10A, which shows a three-dimensional diagram of a non-volatile memory device according to an embodiment of the present invention. As shown in FIG. 10A, a non-volatile memory device 100 according to the present invention includes: an insulation layer 102, writing wires 1042 and 1071, Schottky diodes 1031 and 1032, a memory unit 105, a selection wire 106 and connection conduction units 1072 and 104.

This embodiment is different from the embodiment shown in FIGS. 9A and 9B in that, in this embodiment, the N-conductivity type region (for example, the cathode of the Schottky diode 1031) is stacked and connected on the metal end (for example, the anode of the Schottky diode 1031); while in the embodiment shown in FIGS. 9A and 9B, the metal end (for example, the second end 931b, i.e. the anode of the Schottky diode 931) is stacked and connected on the N-conductivity type region (for example, the first end 931a, i.e. the cathode of the Schottky diode 931). This embodiment indicates that the present invention can be embodied to stack and connect the N-conductivity type region on the metal end, or to stack and connect the metal end on the N-conductivity type region, either way is workable depending on the needs of the operation of the circuitry, with different directions of the conduction current of the Schottky diode.

Figure 10B:
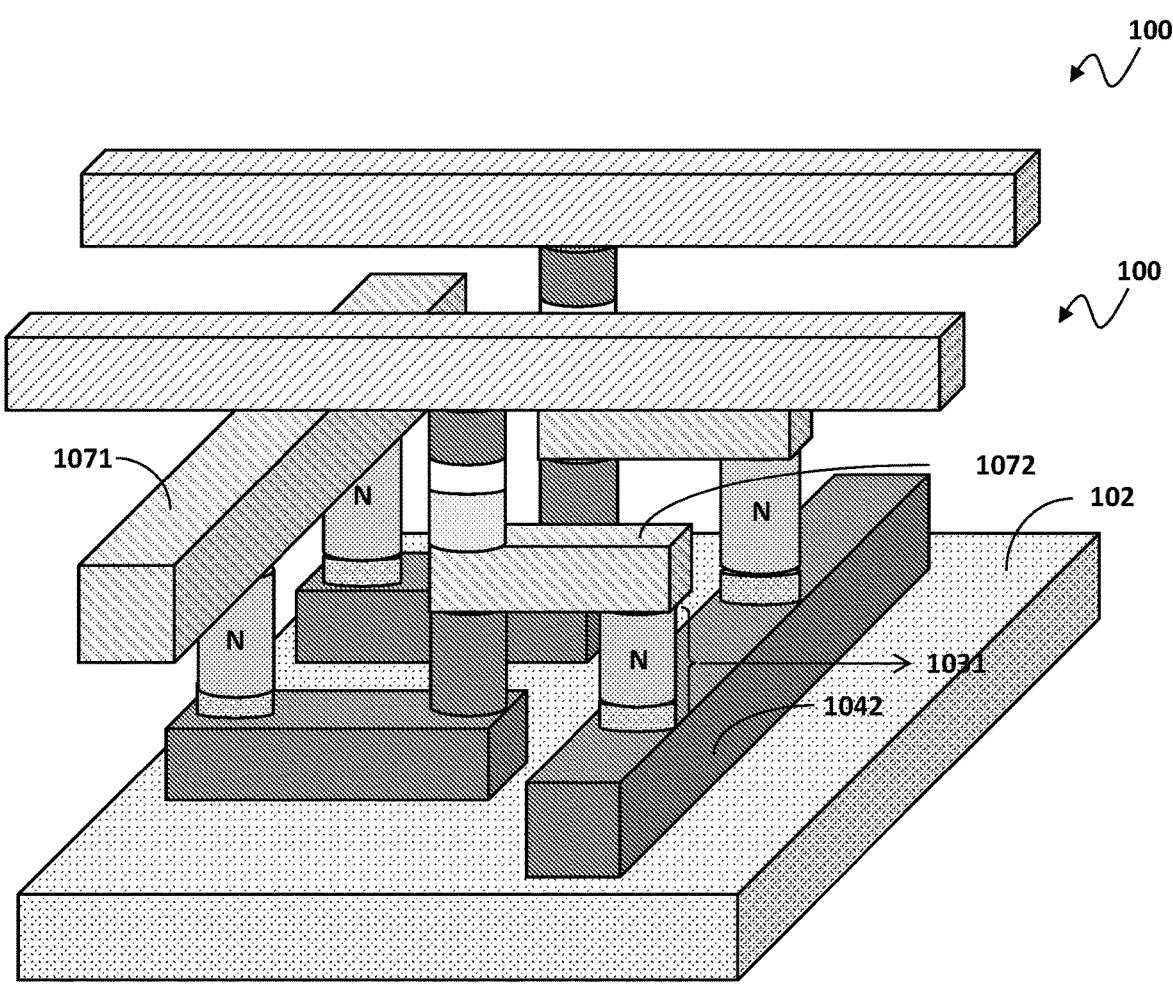
FIG. 10B shows a three-dimensional diagram of a non-volatile memory device according to an embodiment of the present invention.

Please refer to FIG. 10B, which shows a three-dimensional diagram of a non-volatile memory device according to an embodiment of present invention. This embodiment the demonstrates how plural non-volatile memory devices can be arranged and connected. As shown in FIG. 10B, the non-volatile memory devices 100 and 100' for example can share one writing wire 1042 and one writing wire 1071.

Figure 11A:
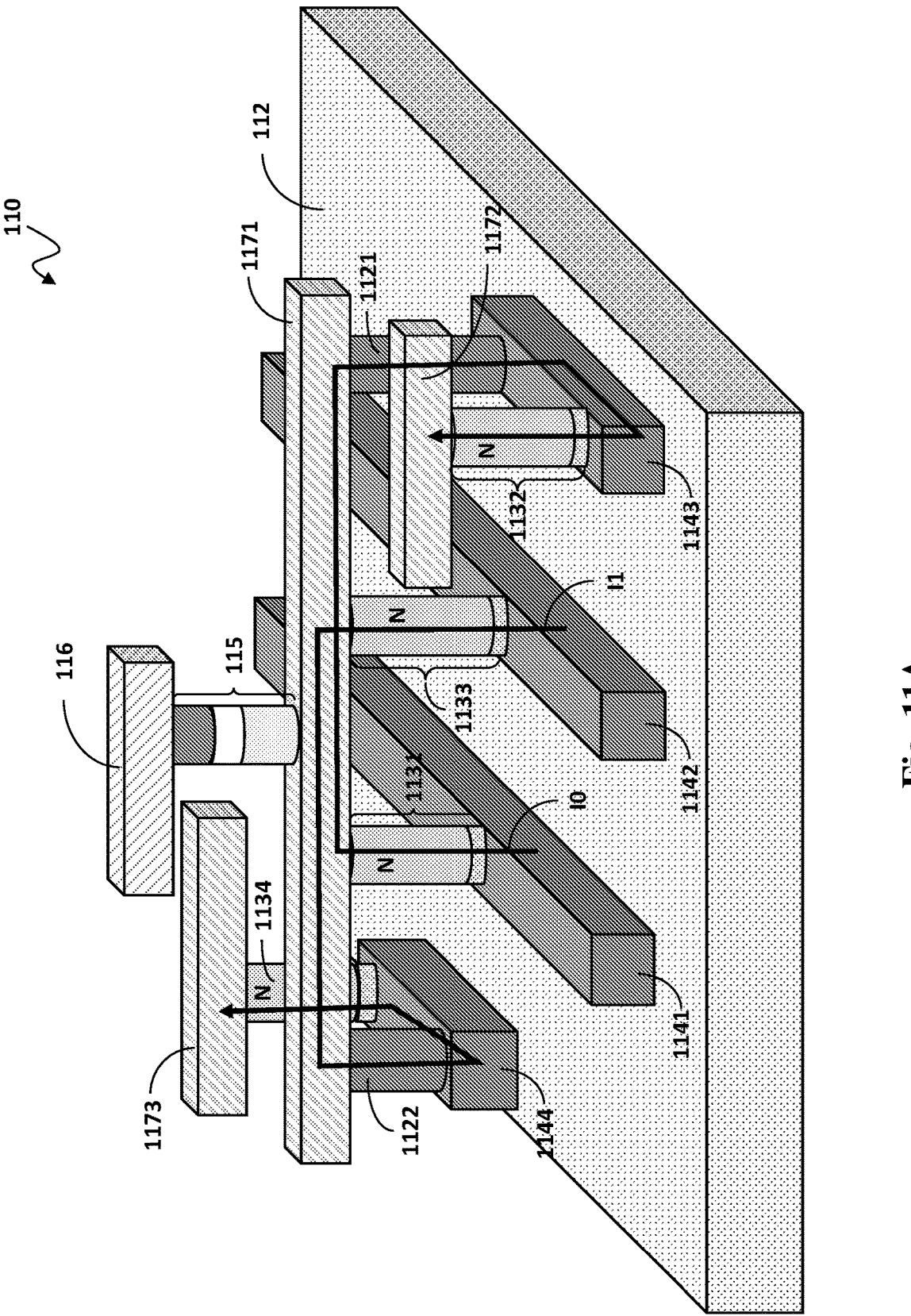

Please refer to FIG. 11A and FIG. 11B. FIG. 11A shows a three-dimensional diagram of a non-volatile memory device according to an embodiment of the present invention, while, FIG. 11B shows an operation table corresponding to an operation of FIG. 11A. As shown in FIG. 11A, a non-volatile memory device 110 according to the present invention is a five end device and is formed on a semiconductor substrate (not shown; please refer to other embodiments, such as the semiconductor substrate 91 shown in FIG. 9A). The non-volatile memory device 110 includes: an insulation layer 112, a first bit line 1141, a second bit line 1142, a first word line 1172, a second word line 1173, a first Schottky diode 1131, a second Schottky diode 1133, a third Schottky diode 1132, a fourth Schottky diode 1134, a first connection conduction unit 1143, a second connection conduction unit 1144, a third connection conduction unit 1121, a fourth connection conduction unit 1122, a fifth connection conduction unit 1171, a memory unit 115, and a read selection wire 116. The five ends of non-volatile memory device 110 are the first bit lines 1141, the second bit line 1142, the first word line 1172, the second word line 1173, and the read selection wire 116.

The insulation layer 112 is formed on the semiconductor substrate (not shown), wherein the insulation layer 112 is electrically insulative. The first bit line 1141 the second bit line 1142, the first word line 1172 and the second word line 1173 are conductive. The first bit line 1141 and the second bit line 1142 are conductive and are formed on and connected to top of the insulation layer 112, wherein the first bit line 1141 and the second bit line 1142 are formed in a first metal layer.

The first connection conduction unit 1143 and the second connection conduction unit 1144 are conductive and are formed on and connected to top of the insulation layer 112, wherein the first connection conduction unit 1143 and the second connection conduction unit 1144 are formed in the first metal layer same with the first bit line 1141 and the second bit line 1142.

The first Schottky diode 1131 and the second Schottky diode 1133 are formed on and connected to the first bit line 1141 and the second bit line 1142 respectively, wherein the first Schottky diode 1131 and the second Schottky diode 1133 are stacked on and electrically connected to the first bit line 1141 and the second bit line 1142 respectively The third Schottky diode 1132 and the fourth Schottky diode 1134 are formed on and connected to the first connection conduction unit 1143 and the second connection conduction unit 1144 respectively, wherein the third Schottky diode 1132 and the fourth Schottky diode 1134 are stacked on and electrically connected to the first connection conduction unit 1143 and the second connection conduction unit 1144 respectively.

The third connection conduction unit 1121 and the fourth connection conduction unit 1122 are conductive and are stacked on and electrically connected to the first connection conduction unit 1143 and the second connection conduction unit 1144 respectively.

The fifth connection conduction unit 1171 is conductive and is stacked on and electrically connected to the third connection conduction unit 1121, the fourth connection conduction unit 1122, the first Schottky diode 1131, and the second Schottky diode 1133, wherein the fifth connection conduction unit 1171 is formed in a second metal layer.

The first word line 1172 and the second word line 1173 are conductive and are stacked on and electrically connected to the third Schottky diode 1132 and the fourth Schottky diode 1134 respectively, wherein the first word line 1172 and the second word line 1173 are formed in the second metal layer same with the fifth connection conduction unit 1171.

The memory unit 115 is stacked on and is electrically connected to the fifth connection conduction unit 1171. The read selection wire 116 is stacked on and is electrically connected to the memory unit 115.

In a case where the non-volatile memory device 110 is selected for a data to be written into, a first current I0 flows through the first bit line 1141, the first Schottky diode 1131, the fifth connection conduction unit 1171, the third connection conduction unit 1121, the first connection conduction unit 1143, the third Schottky diode 1132, and the first word line 1172 in sequence, so as to write the data into the memory unit 115. In a case where the non-volatile memory device 110 is selected for another data to be written into, a second current I1 flows through the second bit line 1142, the second Schottky diode 1133, the fifth connection conduction unit 1171, the fourth connection conduction unit 1122, the second connection conduction unit 1144, the fourth Schottky diode 1134, and the second word line 1173 in sequence, so as to write the other data into the memory unit 115. This embodiment can be applied, for example but not limited to, a spin orbit torque (SOT) type MRAM (SOT-MRAM) device.

In one embodiment as an example, as shown by the operation table in FIG. 11B, when an addressing operation selects the non-volatile memory device 110 to write a data indicative of "0" (or "1" depending on the definition of the bit) into the memory unit 115, the first bit line 1141 is electrically connected to a writing voltage Vw and the first word line 1172 is electrically connected to a ground level, so as to generate the first current I0. As a result, the thus generated first current I0 flows from the first bit line 1141, through the first Schottky diode 1131 (where the metal end anode is at a lower position whereas the N-conductivity type region cathode is at an upper position), the fifth connection conduction unit 1171, the third connection conduction unit 1121, the first connection conduction unit 1143, the third Schottky diode 1132 (where the metal end anode is at a lower position whereas the N-conductivity type region cathode is at an upper position), to the first word line 1172. Because the first current I0 flows through the fifth connection conduction unit 1171 electrically connected to the electrode of the memory unit 115, a magnetization orientation of a magnetic area in the memory unit 115 is changed, whereby a data indicative of "0" (or "1" depending on the definition of the bit) is written into the memory unit 115. In regard to the second bit line 1142 and the second word line 1173 and the read selection wire 116, under such situation, the second bit line 1142 and the second word line 1173 and the read selection wire 116 are electrically floating. With respect to unselected non-volatile memory devices 110, the first bit lines 1141, the second bit line 1142, the first word line 1172, the second word line 1173, and the read selection wires 116 of the unselected non-volatile memory devices 110 for example can also be electrically floating.

On the other hand, for another example, as shown by the operation table in FIG. 11B, when an addressing operation selects the non-volatile memory device 110, to write a data indicative of "1" (or "0" depending on the definition of the bit) into the memory unit 115, the second bit line 1142 is electrically connected to the writing voltage Vw and the second word line 1173 is electrically connected to the ground level, so as to generate the second current I1. As a result, the thus generated second current I1 flows from the second bit line 1142, through the second Schottky diode 1133 (where the metal end anode is at a lower position whereas the N-conductivity type region cathode is at an upper position), through the fifth connection conduction unit 1171, the fourth connection conduction unit 1122, the second connection conduction unit 1144, the fourth Schottky diode 1134 (where the metal end anode is at a lower position whereas the N-conductivity type region cathode is at an upper position), to the second word line 1173. Because the second current I1 flows through the fifth connection conduction unit 1171 electrically connected to the electrode of the memory unit 115 a magnetization orientation of a magnetic area in the memory unit 115 is changed, but the direction along which the second current I1 flows through the memory unit 115 is opposite to the direction along which the first current I0 flows through the memory unit 115 to write a data indicative of "0", so a data indicative of "1" is written into the memory unit 115. In regard to the first bit line 1141 and the first word line 1172 and the read selection wire 116, under such situation, the first bit line 1141 and the first word line 1172 and the read selection wire 116 are electrically floating. With respect to unselected non-volatile memory devices 110, the first bit lines 1141 the second bit lines 1142, the first word lines 1172, and the second word lines 1173 and the read selection wires 116 of the unselected non-volatile memory devices 110 for example can also be electrically floating.

In one embodiment, the non-volatile memory device 110 can read data stored in the memory unit 115 by electrically connecting the read selection wire 116 to a reading voltage Vr, and determining that the data stored in the memory unit 115 is "0" or "1" according to a voltage of the second bit line 1142.

Figure 11C:
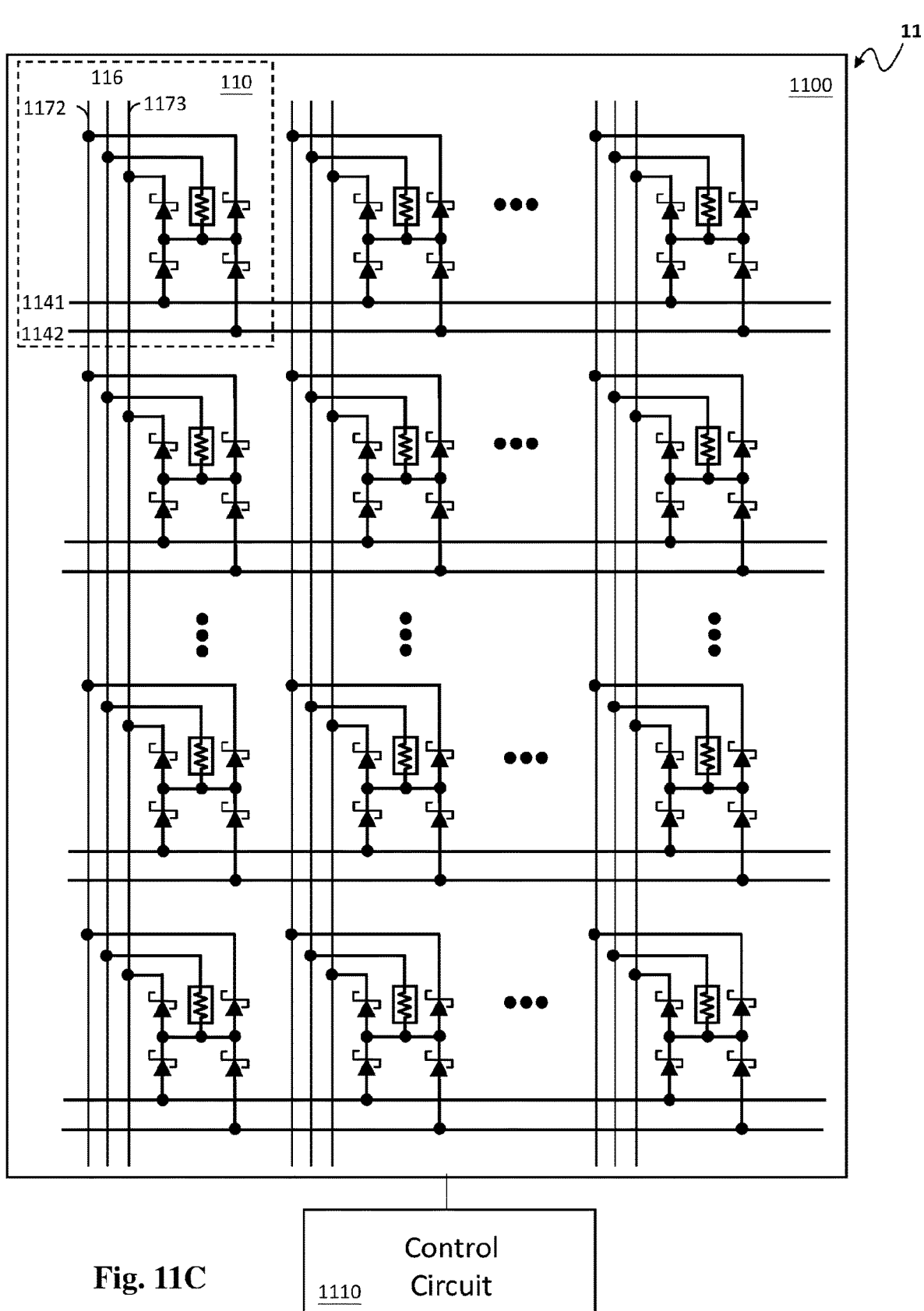
FIG. 11C shows a schematic diagram of a non-volatile memory circuit according to an embodiment of the present invention.

FIG. 11C shows a schematic diagram of a non-volatile memory circuit according to an embodiment of the present invention. As shown in FIG. 11C and also referring to FIG. 11A, the non-volatile memory circuit 11 includes: a non-volatile memory device array 1100 including plural non-volatile memory devices 110; and a control circuit 1110 controlling the non-volatile memory device array 1100 so as to read from or write into the non-volatile memory devices 110; wherein the non-volatile memory device 110, as shown by FIG. 11A, includes: an insulation layer 112, a first bit line 1141, a second bit line 1142, a first word line 1172, a second word line 1173, a first Schottky diode 1131, a second Schottky diode 1133, a third Schottky diode 1132, a fourth Schottky diode 1134, a first connection conduction unit 1143, a second connection conduction unit 1144, a third connection conduction unit 1121, a fourth connection conduction unit 1122, a fifth connection conduction unit 1171, a memory unit 115, and a read selection wire 116. The five ends of non-volatile memory device 110 are the first bit lines 1141, the second bit line 1142, the first word line 1172, the second word line 1173, and the read selection wire 116.

The insulation layer 112 is formed on the semiconductor substrate (not shown), wherein the insulation layer 112 is electrically insulative. The first bit line 1141 the second bit line 1142, the first word line 1172 and the second word line 1173 are conductive. The first bit line 1141 and the second bit line 1142 are conductive and are formed on and connected to top of the insulation layer 112, wherein the first bit line 1141 and the second bit line 1142 are formed in a first metal layer.

The first connection conduction unit 1143 and the second connection conduction unit 1144 are conductive and are formed on and connected to top of the insulation layer 112, wherein the first connection conduction unit 1143 and the second connection conduction unit 1144 are formed in the first metal layer same with the first bit line 1141 and the second bit line 1142.

The first Schottky diode 1131 and the second Schottky diode 1133 are formed on and connected to the first bit line 1141 and the second bit line 1142 respectively, wherein the first Schottky diode 1131 and the second Schottky diode 1133 are stacked on and electrically connected to the first bit line 1141 and the second bit line 1142 respectively The third Schottky diode 1132 and the fourth Schottky diode 1134 are formed on and connected to the first connection conduction unit 1143 and the second connection conduction unit 1144 respectively, wherein the third Schottky diode 1132 and the fourth Schottky diode 1134 are stacked on and electrically connected to the first connection conduction unit 1143 and the second connection conduction unit 1144 respectively.

The third connection conduction unit 1121 and the fourth connection conduction unit 1122 are conductive and are stacked on and electrically connected to the first connection conduction unit 1143 and the second connection conduction unit 1144 respectively.

The fifth connection conduction unit 1171 is conductive and is stacked on and electrically connected to the third connection conduction unit 1121, the fourth connection conduction unit 1122, the first Schottky diode 1131, and the second Schottky diode 1133, wherein the fifth connection conduction unit 1171 is formed in a second metal layer.

The first word line 1172 and the second word line 1173 are conductive and are stacked on and electrically connected to the third Schottky diode 1132 and the fourth Schottky diode 1134 respectively, wherein the first word line 1172 and the second word line 1173 are formed in the second metal layer same with the fifth connection conduction unit 1171.

The memory unit 115 is stacked on and is electrically connected to the fifth connection conduction unit 1171. The read selection wire 116 is stacked on and is electrically connected to the memory unit 115.

In a case where the non-volatile memory device 110 is selected for a data to be written into, a first current I0 flows through the first bit line 1141, the first Schottky diode 1131, the fifth connection conduction unit 1171, the third connection conduction unit 1121, the first connection conduction unit 1143, the third Schottky diode 1132, and the first word line 1172 in sequence, so as to write the data into memory unit 115. In a case where the non-volatile memory device 110 is selected for another data to be written into, a second current I1 flows through the second bit line 1142, the second Schottky diode 1133, the fifth connection conduction unit 1171, the fourth connection conduction unit 1122, the second connection conduction unit 1144, the fourth Schottky diode 1134, and the second word line 1173 in sequence, so as to write the other data into the memory unit 115. This embodiment can be applied, for example but not limited to, a spin orbit torque (SOT) type MRAM (SOT-MRAM) device.

Figure 12:
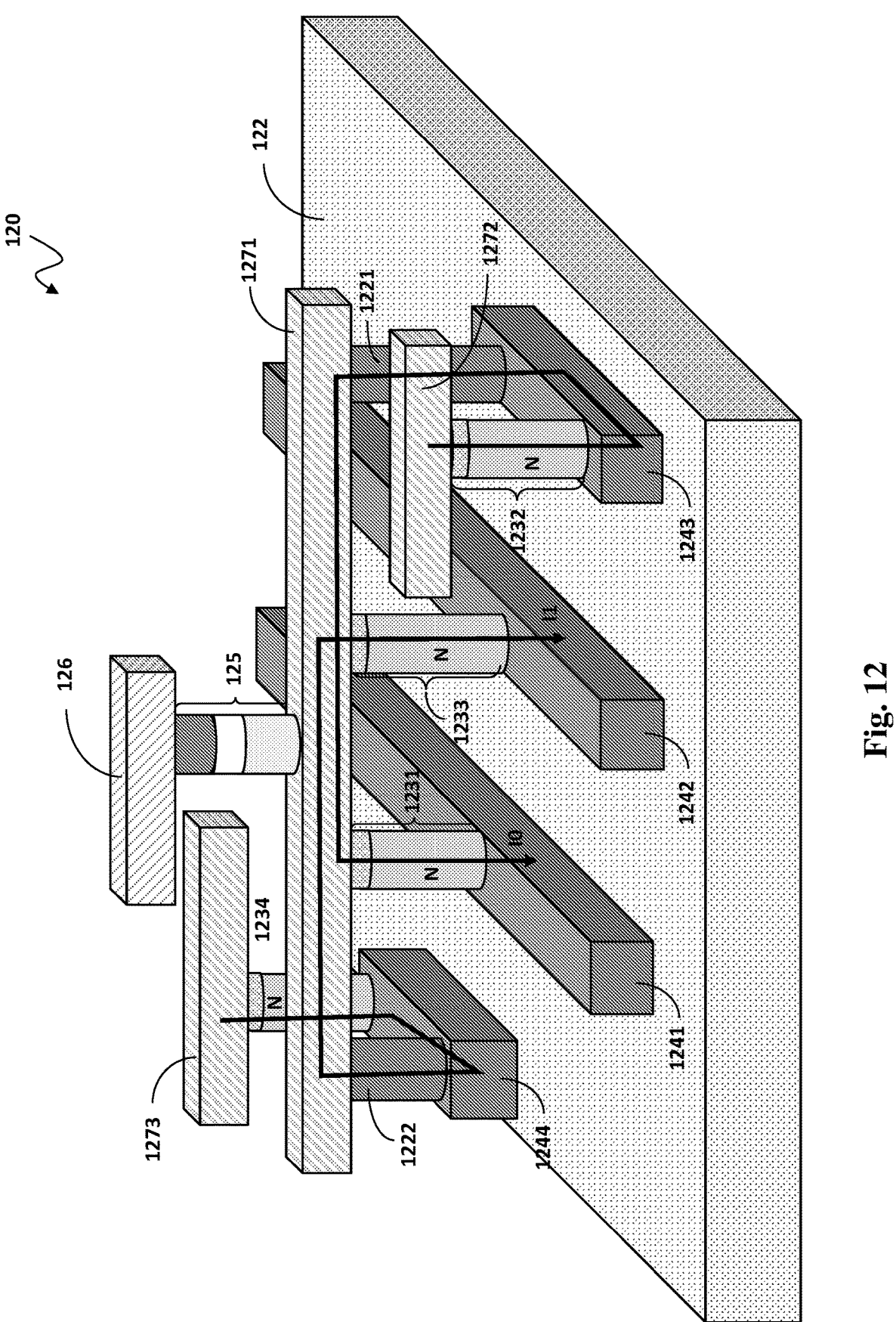
FIG. 12 shows a three-dimensional diagram of a non-volatile memory device according to an embodiment of the present invention.

Please refer to FIG. 12. FIG. 12 shows a three-dimensional diagram of a non-volatile memory device according to an embodiment of the present invention. As shown in FIG. 12, a non-volatile memory device 120 according to the present invention is a five end device and is formed on a semiconductor substrate (not shown; please refer to other embodiments, such as the semiconductor substrate 91 shown in FIG. 9A). The non-volatile memory device 120 includes: an insulation layer 122, a first bit line 1241, a second bit line 1242, a first word line 1272, a second word line 1273, a first Schottky diode 1231, a second Schottky diode 1233, a third Schottky diode 1232, a fourth Schottky diode 1234, a first connection conduction unit 1243, a second connection conduction unit 1244, a third connection conduction unit 1221, a fourth connection conduction unit 1222, a fifth connection conduction unit 1271, a memory unit 125, and a read selection wire 126.

This embodiment is different from the embodiment shown in FIGS. 11A and 11B in that, in this embodiment, the metal end anode (for example, the anode of the first Schottky diode 1231) is stacked and connected on the N-conductivity type region cathode (for example, the cathode of the first Schottky diode 1231); while in the embodiment shown in FIGS. 11A and 11B, the N-conductivity type region cathode (for example, the cathode of the first Schottky diode 1131) is stacked and connected on the metal end anode (for example, the anode of the first Schottky diode 1131). This embodiment indicates that the present invention can be embodied to stack and connect the N-conductivity type region cathode on the metal end anode, or to stack and connect the metal end anode on the N-conductivity type region cathode, either way is workable depending on the needs of the operation of the circuitry, with different directions of the conduction current of the Schottky diode.

Figure 13A:
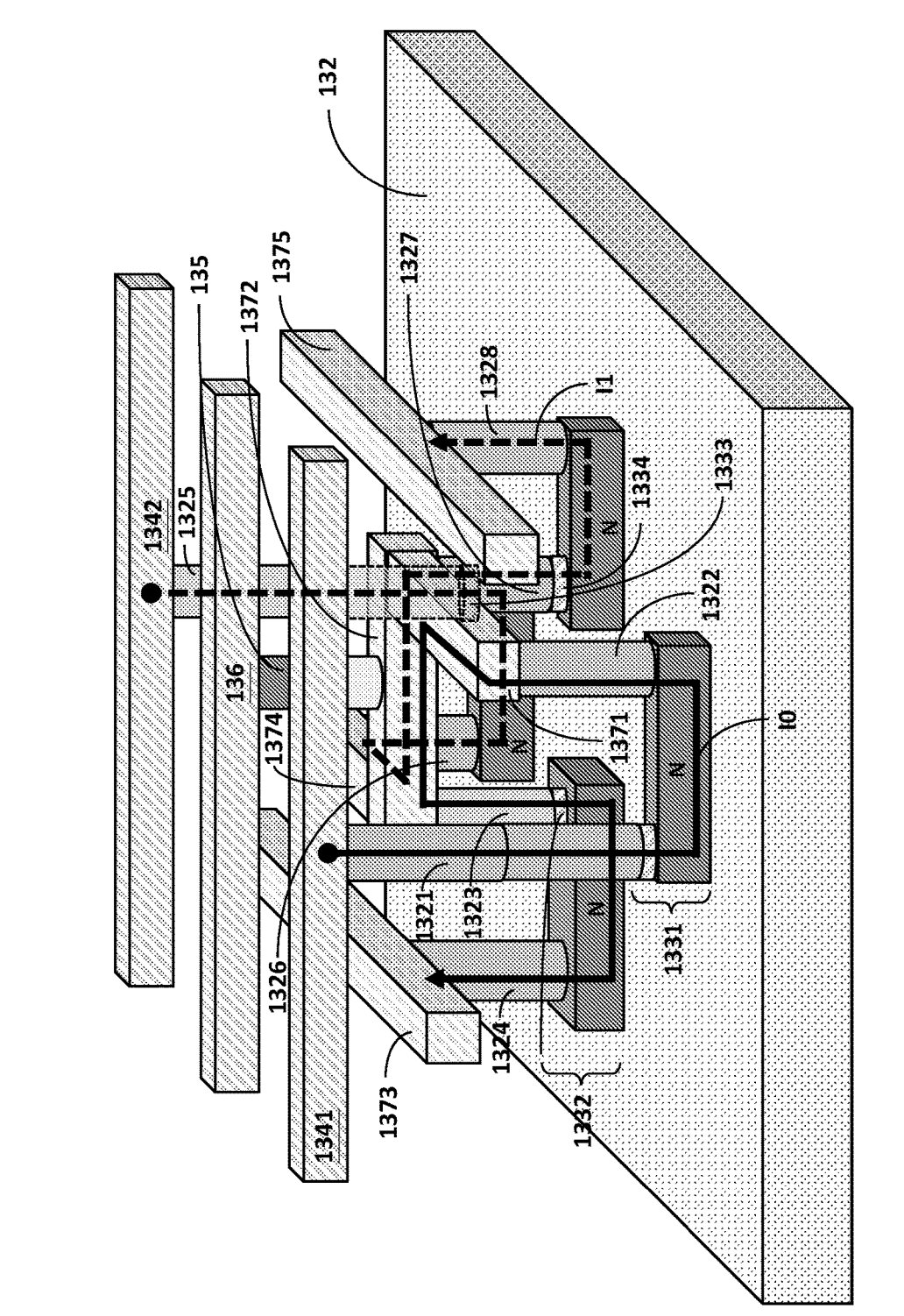
FIG. 13A and FIG. 13B respectively show a three-dimensional diagram and a top view diagram of a non-volatile memory device according to an embodiment of the present invention.
Figure 13B:
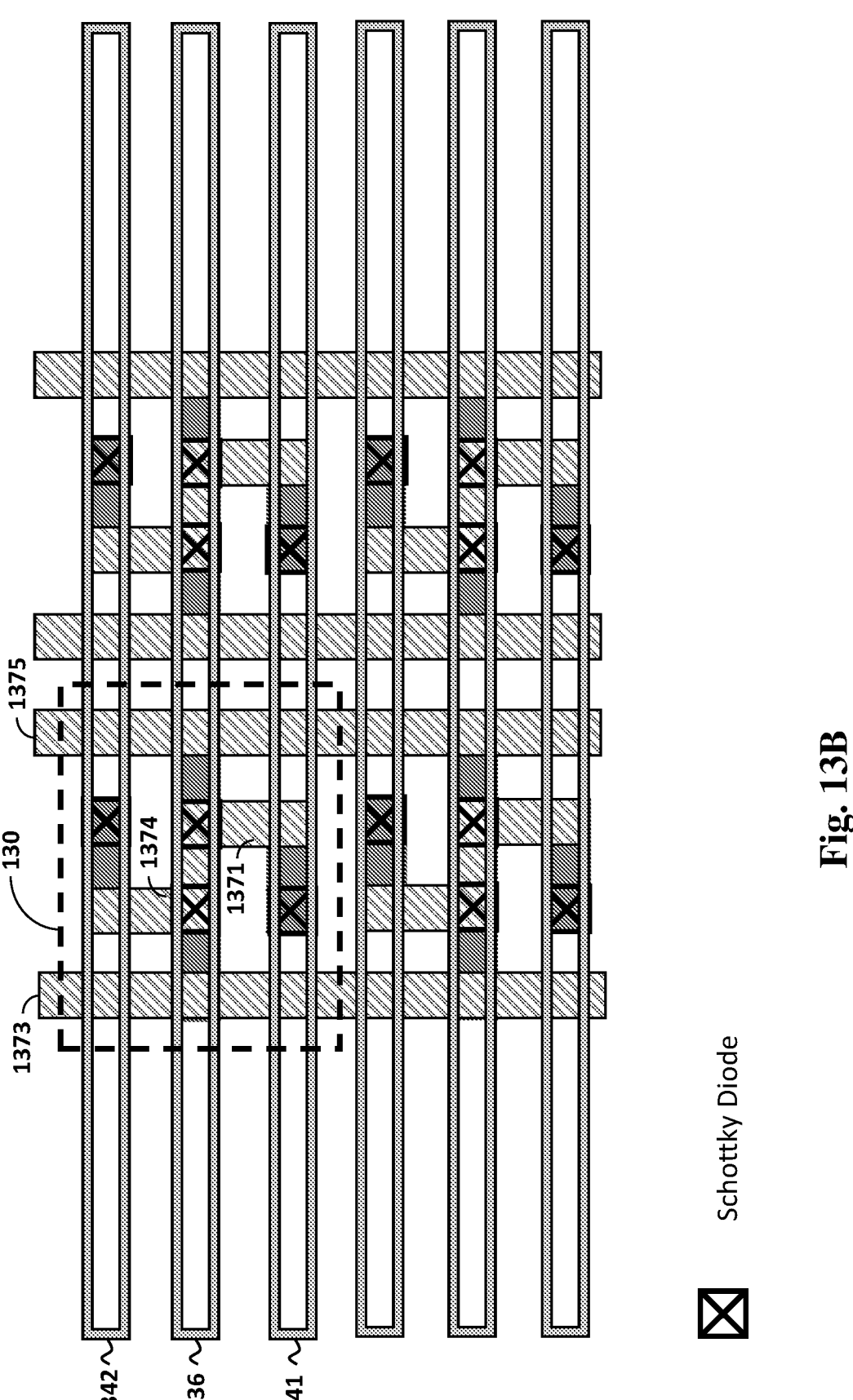

Please refer to FIG. 13A and FIG. 13B. FIG. 13A and FIG. 13B respectively show a three-dimensional diagram and a top view diagram of a non-volatile memory device according to an embodiment of the present invention. As shown in FIG. 13A, a non-volatile memory device 130 according to the present invention is a five end device and is formed on a semiconductor substrate (not shown; please refer to other embodiments, such as the semiconductor substrate 91 shown in FIG. 9A). The non-volatile memory device 130 includes: an insulation layer 132, writing wires 1341 and 1342, conductive wires 1371, 1372, 1373, 1374, and 1375, Schottky diodes 1331, 1332, 1333 and 1334, conductive plugs 1321, 1322, 1323, 1324, 1325, 1326, 1327 and 1328, a memory unit 135, and a selection wire 136. The five ends of non-volatile memory device 130 are the writing wires 1341 and 1342, conductive wires 1373 and 1375, and the selection wire 136.

The insulation layer 132 is formed on the semiconductor substrate (not shown), wherein the insulation layer 132 is electrically insulative. The writing wires 1341 and 1342, and the conductive wires 1371, 1372, 1373, 1374 and 1375 are conductive. The Schottky diodes 1331, 1332, 1333 and 1334 can be, for example but not limited to, Schottky diodes shown in FIG. 13A. The memory unit 135 is located above the Schottky diodes 1331, 1332, 1333 and 1334 and the connection conduction unit (including conductive wires 1371, 1372, 1374 and 1375, and conductive plugs 1322, 1323, 1324, 1326, 1327, and 1328). The selection wire 136 is located on the memory unit 135 and is electrically connected to the memory unit 135. In a case where the non-volatile memory device 130 is selected for a data to be written into, a first current I0 flows from the writing wire 1341 through the Schottky diodes 1331, the conductive plug 1322, the conductive wires 1371 and 1372, the conductive plug 1323, the Schottky diode 1332, the conductive plug 1324, and the conductive wire 1373, so as to write the data into the memory unit 135. In a case where the non-volatile memory device 130 is selected for another data to be written into, a second current I1 flows through the Schottky diodes 1333 and 1334, so as to write the other data into the memory unit 135. This embodiment can be applied, for example but not limited to, a spin orbit torque (SOT) type MRAM (SOT-MRAM) device.

In one embodiment as an example, as shown in FIG. 13A, when an addressing operation selects the non-volatile memory device 130 to write a data indicative of "0" (or "1" depending on the definition of the bit) into the memory unit 135, the writing wire 1341 is electrically connected to a writing voltage Vw and the writing wire 1373 is electrically connected to a ground level, so as to generate the first current I0. As a result, the thus generated first current I0 flows from the writing wire 1341, through the conductive plug 1321, the Schottky diode 1331 (where the metal end is at an upper position whereas the N-conductivity type region is at a lower position), the conductive plug 1322, the connection wires 1371 and 1372, the conductive plug 1323, the Schottky diode 1332, and the conductive plug 1324, to the writing wire 1373. Because the first current I0 flows through the conductive wire 1372 electrically connected to the electrode of the memory unit 135, a magnetization orientation of a magnetic area in the memory unit 135 is changed, whereby a data indicative of "0" is written into the memory unit 135. In regard to the writing wires 1342, the conductive wire 1375 and the selection wire 136, under such situation, the writing wires 1342, the conductive wire 1375 and the selection wire 136 are electrically floating. With respect to unselected non-volatile memory devices 130, the writing wires 1341 and 1342, the conductive wires 1373 and 1375, and the selection wire 136 of the unselected non-volatile memory devices 130 for example can also be electrically floating.

On the other hand, for another example, when an addressing operation selects the non-volatile memory device 130, to write a data indicative of "1" (or "0" depending on the definition of the bit) into the memory unit 135, the writing wire 1342 is electrically connected to the writing voltage Vw and the writing wire 1375 is electrically connected to the ground level, so as to generate the second current I1. As a result, the thus generated second current I1 flows from the writing wire 1342, through the conductive plug 1325, the Schottky diode 1333 (where the metal end is at an upper position whereas the N-conductivity type region is at a lower position), and further through the conductive plug 1326, the conductive wires 1374 and 1372, the conductive plug 1327, the Schottky diode 1334, and the conductive plug 1328, to the writing wire 1375. Because the second current I1 flows through the connection conductive wire 1372 electrically connected to the electrode of the memory unit 135 a magnetization orientation of a magnetic area in the memory unit 135 is changed, but the direction along which the second current I1 flows through the memory unit 135 is opposite to the direction along which the first current I0 flows through the memory unit 135 to write a data indicative of "0", so a data indicative of "1" is written into the memory unit 135. In regard to the writing wires 1341, the conductive 1373 and the selection wire 136, under such situation, the writing wires 1341, the conductive 1373 and the selection wire 136 are electrically floating. With respect to unselected non-volatile memory devices 130, the writing wires 1341 and 1342, the conductive wires 1373 and 1375 and the selection wire 136 of the unselected non-volatile memory devices 130 for example can also be electrically floating.

Please refer to FIG. 13B as well. Note that, in this embodiment, during manufacture of the memory device in semiconductor manufacturing process, the writing wires 1341 and 1342, and the selection wire 136 are formed by one same metal line formation process. The conductive wires 1371, 1372, 1373, 1374, and 1375 are formed by one same metal line formation process. Besides, the conductive plugs 1321, 1322, 1323, 1324, 1325, 1326, 1327 and 1328 are formed by one same conductive plug formation process.

As shown in the top view diagram of FIG. 13, one unit of the non-volatile memory device 130 is indicated by a dashed frame. This embodiment shows an array layout of the non-volatile memory devices in the non-volatile memory circuit according to the present invention. It can be seen that the non-volatile memory circuit according to the present invention has a greatly reduced circuitry area in comparison to the prior art non-volatile memory circuit.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a manufacturing process or a structure which does not substantially influence the primary function of the device can be inserted between any two structures in the shown embodiments.

It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A non-volatile memory device, comprising:
an insulation layer, which is electrically insulative;
a first Schottky diode, which is formed on the insulation layer, wherein a cathode of the first Schottky is formed in a monocrystalline semiconductor layer;
a first writing wire which is conductive, wherein the first writing wire is electrically connected to a first end of the first Schottky diode;
a memory unit, which is located on the first Schottky diode, wherein the memory unit is electrically connected to a second end of the first Schottky diode; and
a selection wire which is conductive, wherein the selection wire is located on the memory unit and is electrically connected to the memory unit;
wherein in a case where the non-volatile memory device is selected for a first data to be written into, a first current flows through the first Schottky diode, so as to write the first data into the memory unit;
wherein the cathode of the first Schottky diode is the first end of the first Schottky diode or the second end of the first Schottky diode.

2. The non-volatile memory device of claim 1, wherein the first Schottky diode is stacked and connected on the insulation layer.

3. The non-volatile memory device of claim 1, wherein the first writing wire is stacked and connected on the insulation layer, and wherein the first Schottky diode is stacked and connected on the first writing wire.

4. The non-volatile memory device of claim 1, further comprising:
a second Schottky diode, which is formed on the insulation layer, wherein a cathode of the second Schottky diode is formed in the monocrystalline semiconductor layer; and
a second writing wire which is conductive, wherein the second writing wire is electrically connected to a first end of the second Schottky diode;
wherein in a case where the non-volatile memory device is selected to for a second data to be written into, a second current flows through the second Schottky diode, so as to write the second data into the memory unit;
wherein the memory unit is electrically connected to a second end of the second Schottky diode;
wherein the cathode of the second Schottky diode is the first end of the second Schottky diode or the second end of the second Schottky diode.

5. The non-volatile memory device of claim 4, wherein the second Schottky diode is stacked and connected on the insulation layer.

6. The non-volatile memory device of claim 4, wherein the second writing wire is stacked and connected on the insulation layer, and wherein the second Schottky diode is stacked and connected on the second writing wire.

7. The non-volatile memory device of claim 4, further comprising:
a first connection conduction unit, which is configured to electrically connect the memory unit to the second end of the first Schottky diode, wherein a portion of the first connection conduction unit is stacked and connected on the second end of the first Schottky diode; and
a second connection conduction unit, which is configured to electrically connect the first connection conduction unit to the second end of the second Schottky diode, so that the memory unit is electrically connected to the second end of the second Schottky diode;
wherein the first writing wire is stacked and connected on the insulation layer, and wherein the first end of the first Schottky diode is stacked and connected on the first writing wire, and wherein the second end of the first Schottky diode is stacked and connected on the first end of the first Schottky diode;
wherein a first portion of the second connection conduction unit is stacked and connected on the insulation layer, and wherein a second portion of the second connection conduction unit is stacked and connected on the first portion of the second connection conduction unit, and wherein another portion of the first connection conduction unit is stacked and connected on the second portion of the second connection conduction unit;
wherein the second end of the second Schottky diode is stacked and connected on the first portion of the second connection conduction unit, and wherein the first end of the second Schottky diode is stacked and connected on the second end of the second Schottky diode, and wherein the second writing wire is stacked and connected on the first end of the second Schottky diode;
wherein the first writing wire and the first portion of the second connection conduction unit are formed by one same metal line formation process.

8. The non-volatile memory device of claim 7, wherein the first connection conduction unit and the second writing wire are formed by one same metal line formation process.

9. The non-volatile memory device of claim 4, further comprising:

a second connection conduction unit, which is electrically connected between the second Schottky diode and the memory unit, wherein the second connection conduction unit is configured to electrically connect the memory unit to the second end of the second Schottky diode.

10. The non-volatile memory device of claim 4, wherein the first writing wire and the second writing wire are both metal wires.

11. The non-volatile memory device of claim 1, further comprising:

a first connection conduction unit, which is electrically connected between the first Schottky diode and the memory unit, wherein the first connection conduction unit is configured to electrically connect the memory unit to the second end of the first Schottky diode.

12. The non-volatile memory device of claim 1, wherein the non-volatile memory device is a phase change random access memory (PCRAM)), a magnetoresistive random access memory (MRAM) or a resistive random access memory (RRAM).

13. The non-volatile memory device of claim 1, wherein the first writing wire is a metal wire.

14. The non-volatile memory device of claim 1, wherein the non-volatile memory device is formed on a semiconductor-on-insulator (SOI) substrate or a semiconductor-metal-on-insulator (SMOI) substrate.

15. The non-volatile memory device of claim 1, wherein the monocrystalline semiconductor layer includes a monocrystalline silicon layer, a monocrystalline germanium layer, a hexagonal boron nitride layer or a monocrystalline gallium arsenide layer.

16. A non-volatile memory circuit, comprising:

a non-volatile memory device array including a plurality of non-volatile memory devices; and a control circuit configured to operably control the non-volatile memory device array so as to read from or write into the non-volatile memory devices;

wherein the non-volatile memory device includes:

an insulation layer, which is electrically insulative;

a first Schottky diode, which is formed on the insulation layer, wherein a cathode of the first Schottky is formed in a monocrystalline semiconductor layer;

a first writing wire which is conductive, wherein the first writing wire is electrically connected to a first end of the first Schottky diode;

a memory unit, which is located on the first Schottky diode, wherein the memory unit is electrically connected to a second end of the first Schottky diode; and a selection wire which is conductive, wherein the selection wire is located on the memory unit and is electrically connected to the memory unit; wherein in a case where the non-volatile memory device is selected for a first data to be written into, a first current flows through the first Schottky diode, so as to write the first data into the memory unit; wherein the cathode of the first Schottky diode is the first end of the first Schottky diode or the second end of the first Schottky diode.

17. The non-volatile memory circuit of claim 16, wherein the first Schottky diode is stacked and connected on the insulation layer.

18. The non-volatile memory circuit of claim 16, wherein the first writing wire is stacked and connected on the insulation layer, and wherein the first Schottky diode is stacked and connected on the first writing wire.

19. The non-volatile memory circuit of claim 16, wherein the non-volatile memory device further comprises:

a second Schottky diode, which is formed on the insulation layer, wherein a cathode of the second Schottky diode is formed in the monocrystalline semiconductor layer;

a second writing wire which is conductive, wherein the second writing wire is electrically connected to a first end of the second Schottky diode;

wherein in a case where the non-volatile memory device is selected to for a second data to be written into, a second current flows through the second Schottky diode, so as to write the second data into the memory unit;

wherein the memory unit is electrically connected to a second end of the second Schottky diode;

wherein the cathode of the second Schottky diode is the first end of the second Schottky diode or the second end of the second Schottky diode.

20. The non-volatile memory circuit of claim 19 wherein the second Schottky diode is stacked and connected on the insulation layer.

21. The non-volatile memory circuit of claim 19, wherein the second writing wire is stacked and connected on the insulation layer, and wherein the second Schottky diode is stacked and connected on the second writing wire.

22. The non-volatile memory circuit of claim 19, wherein the non-volatile memory device further comprises:

a first connection conduction unit, which is configured to electrically connect the memory unit to the second end of the first Schottky diode, wherein a portion of the first connection conduction unit is stacked and connected on the second end of the first Schottky diode; and a second connection conduction unit, which is configured to electrically connect the first connection conduction unit to the second end of the second Schottky diode, so that the memory unit is electrically connected to the second end of the second Schottky diode;

wherein the first writing wire is stacked and connected on the insulation layer, and wherein the first end of the first Schottky diode is stacked and connected on the first writing wire, and wherein the second end of the first Schottky diode is stacked and connected on the first end of the first Schottky diode;

wherein a first portion of the second connection conduction unit is stacked and connected on the insulation layer, and wherein a second portion of the second connection conduction unit is stacked and connected on the first portion of the second connection conduction unit, and wherein another portion of the first connection conduction unit is stacked and connected on the second portion of the second connection conduction unit;

wherein the second end of the second Schottky diode is stacked and connected on the first portion of the second connection conduction unit, and wherein the first end of the second Schottky diode is stacked and connected on the second end of the second Schottky diode, and wherein the second writing wire is stacked and connected on the first end of the second Schottky diode;

wherein the first writing wire and the first portion of the second connection conduction unit are formed by one same metal line formation process.

23. The non-volatile memory circuit of claim 16, wherein the non-volatile memory device further comprises:

a first connection conduction unit, which is electrically connected between the first Schottky diode and the memory unit, wherein the first connection conduction unit is configured to electrically connect the memory unit to the second end of the first Schottky diode.

24. The non-volatile memory circuit of claim 16, wherein the non-volatile memory device further comprises:

a second connection conduction unit, which is electrically connected between the second Schottky diode and the memory unit, wherein the second connection conduction unit is configured to electrically connect the memory unit to the second end of the second Schottky diode.

25. The non-volatile memory circuit of claim 16, wherein the non-volatile memory device is a phase change random access memory (PCRAM)), a magnetoresistive random access memory (MRAM) or a resistive random access memory (RRAM).

26. The non-volatile memory circuit of claim 16, wherein the monocrystalline semiconductor layer includes a monocrystalline silicon layer, a monocrystalline germanium layer, a hexagonal boron nitride layer or a monocrystalline gallium arsenide layer.

27. A non-volatile memory device, comprising:

an insulation layer, which is electrically insulative;

a first bit line and a second bit line, which are conductive and are formed on and connected to top of the insulation layer, wherein the first bit line and the second bit line are formed in a first metal layer;

a first connection conduction unit and a second connection conduction unit, which are conductive and are formed on and connected to top of the insulation layer, wherein the first connection conduction unit and the second connection conduction unit are formed in the first metal layer same with the first bit line and the second bit line;

a first Schottky diode and a second Schottky diode, which are formed on and connected to the first bit line and the second bit line respectively, wherein the first Schottky diode and the second Schottky diode are stacked on and electrically connected to the first bit line and the second bit line respectively;

a third Schottky diode and a fourth Schottky diode, which are formed on and connected to the first connection conduction unit and the second connection conduction unit respectively, wherein the third Schottky diode and the fourth Schottky diode are stacked on and electrically connected to the first connection conduction unit and the second connection conduction unit respectively;

a third connection conduction unit and a fourth connection conduction unit, which are conductive and are stacked on and electrically connected to the first connection conduction unit and the second connection conduction unit respectively;

a fifth connection conduction unit, which is conductive and is stacked on and electrically connected to the third connection conduction unit, the fourth connection conduction unit, the first Schottky diode, and the second Schottky diode, wherein the fifth connection conduction unit is formed in a second metal layer;

a first word line and a second word line, which are conductive and are stacked on and electrically connected to the third Schottky diode and the fourth Schottky diode respectively, wherein the first word line and the second word line are formed in the second metal layer same with the fifth connection conduction unit;

a memory unit, which is stacked on and is electrically connected to the fifth connection conduction unit; and a read selection wire, which is stacked on and is electrically connected to the memory unit;

wherein in a case where the non-volatile memory device is selected for a first data to be written into, a first current flows through the first bit line, the first Schottky diode, the fifth connection conduction unit, the third connection conduction unit, the first connection conduction unit, the third Schottky diode, and the first word line in sequence, so as to write the first data into the memory unit;

wherein in a case where the non-volatile memory device is selected to for a second data to be written into, a second current flows through the second bit line, the second Schottky diode, the fifth connection conduction unit, the fourth connection conduction unit, the second connection conduction unit, the fourth Schottky diode, and the second word line in sequence, so as to write the second data into the memory unit.

28. The non-volatile memory circuit of claim 27, wherein each of the first Schottky diode, the second Schottky diode, the third Schottky diode, and the fourth Schottky diode includes an anode and a cathode, wherein the cathode is stacked on the anode, or the anode is stacked on the cathode.

* * * * *